United States Patent
Boutami et al.

(10) Patent No.: US 12,148,869 B2
(45) Date of Patent: Nov. 19, 2024

(54) GUIDED LIGHT EXTRACTION IN TRENCHES

(71) Applicant: Meta Platforms Technologies, LLC, Menlo Park, CA (US)

(72) Inventors: Salim Boutami, Seattle, WA (US); Jeomoh Kim, Plymouth (GB)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 418 days.

(21) Appl. No.: 17/703,616

(22) Filed: Mar. 24, 2022

(65) Prior Publication Data

US 2023/0307593 A1 Sep. 28, 2023

(51) Int. Cl.
*H01L 33/60* (2010.01)
*G02B 27/01* (2006.01)
*H01L 33/62* (2010.01)

(52) U.S. Cl.
CPC .......... *H01L 33/60* (2013.01); *G02B 27/0172* (2013.01); *H01L 33/62* (2013.01); *G02B 2027/0178* (2013.01)

(58) Field of Classification Search
CPC ......... H01L 33/60; H01L 33/62; H01L 33/20; H01L 27/153; G02B 27/0172; G02B 2027/0178

USPC .......................................................... 257/99
See application file for complete search history.

(56) References Cited

U.S. PATENT DOCUMENTS

| | | |
|---|---|---|
| 2017/0103966 A1 | 4/2017 | Choi et al. |
| 2019/0229245 A1 | 7/2019 | Chen |
| 2021/0159373 A1 | 5/2021 | Grundmann |
| 2024/0215426 A1* | 6/2024 | Chen .................... H10K 50/115 |

OTHER PUBLICATIONS

International Search Report and Written Opinion for International Application No. PCT/US2023/016107, mailed Jul. 27, 2023, 8 pages.

* cited by examiner

*Primary Examiner* — Tan N Tran
(74) *Attorney, Agent, or Firm* — Weaver Austin Villeneuve & Sampson LLP

(57) ABSTRACT

A micro-light emitting diode (micro-LED) device includes semiconductor mesa structures, and waveguides and grating couplers in regions of a semiconductor layer between the semiconductor mesa structures. At least some light emitted in the active region of each semiconductor mesa structure can be coupled into and guided by a waveguide towards a grating coupler. The grating coupler is configured to diffract the guided light out of the micro-LED device, for example, in a direction substantially perpendicular to the light-emitting surface of the micro-LED device, through regions between the semiconductor mesa structures.

20 Claims, 20 Drawing Sheets

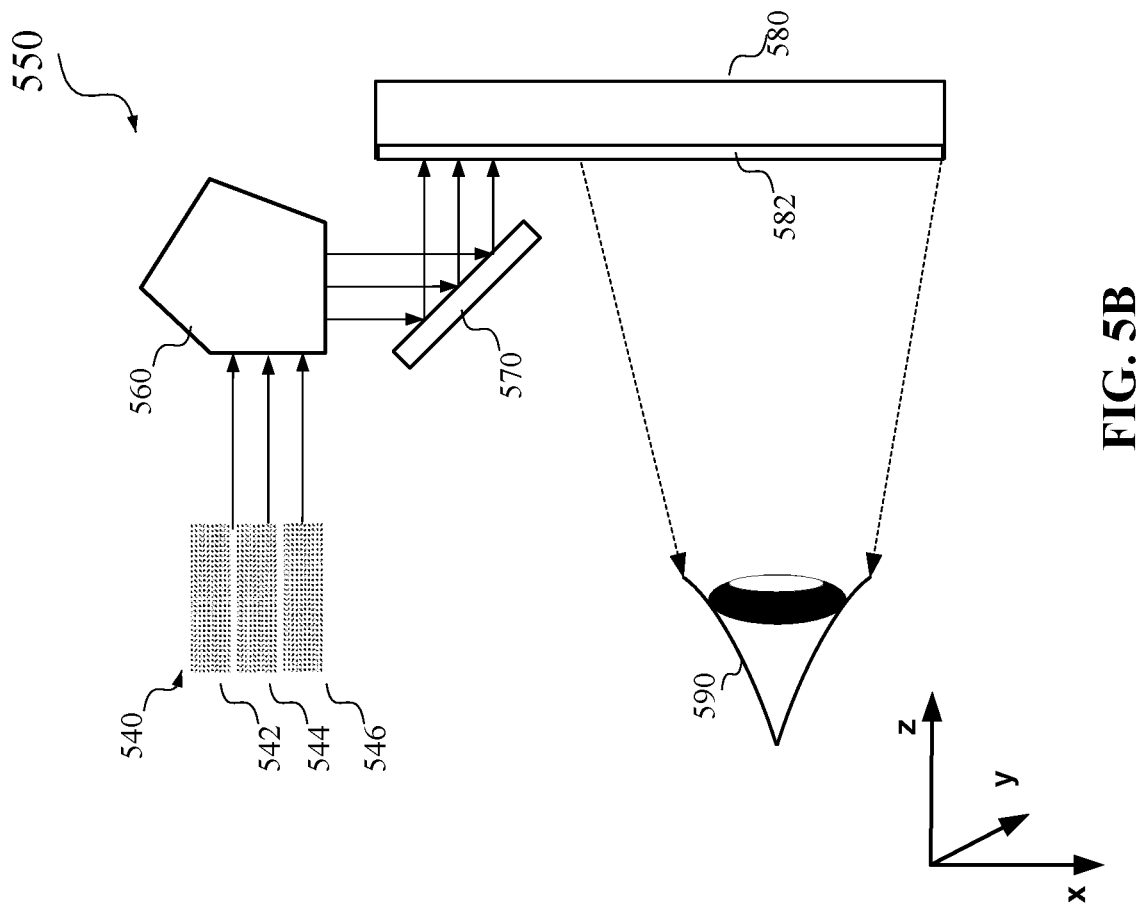
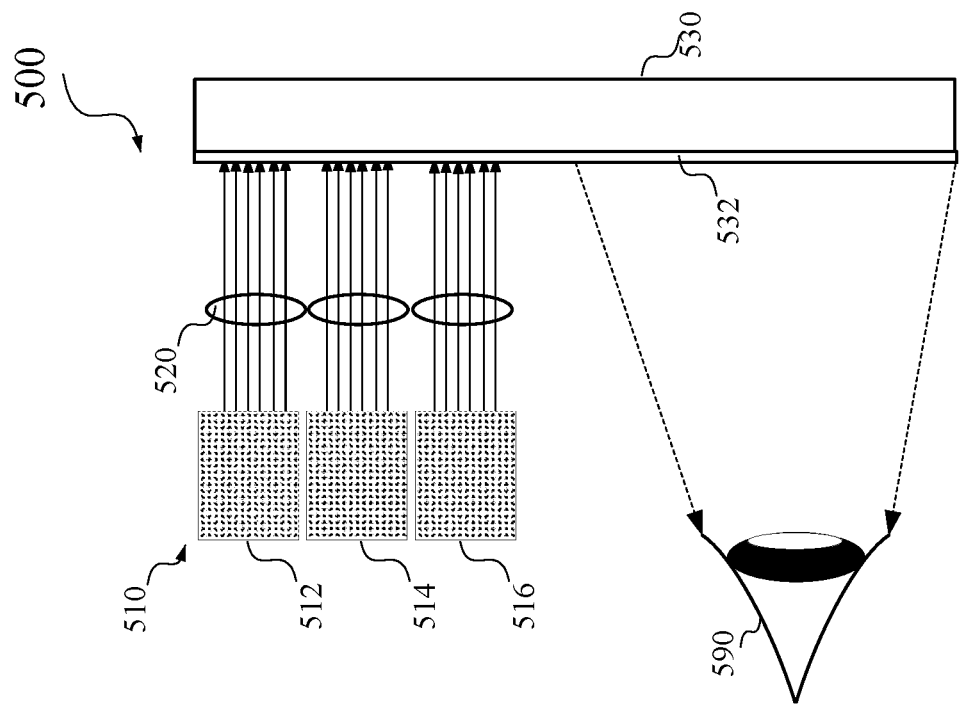
FIG. 5B
FIG. 5A

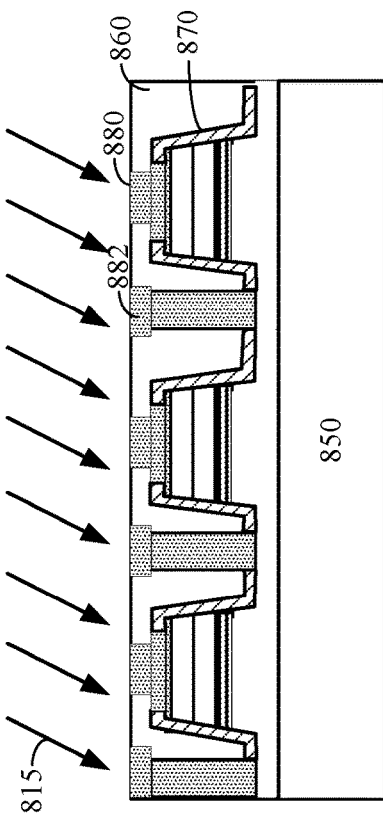
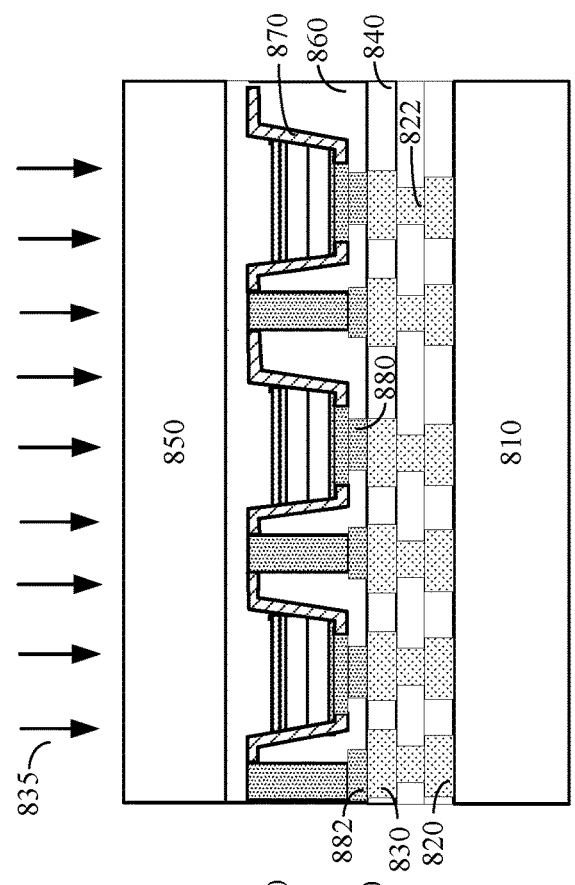
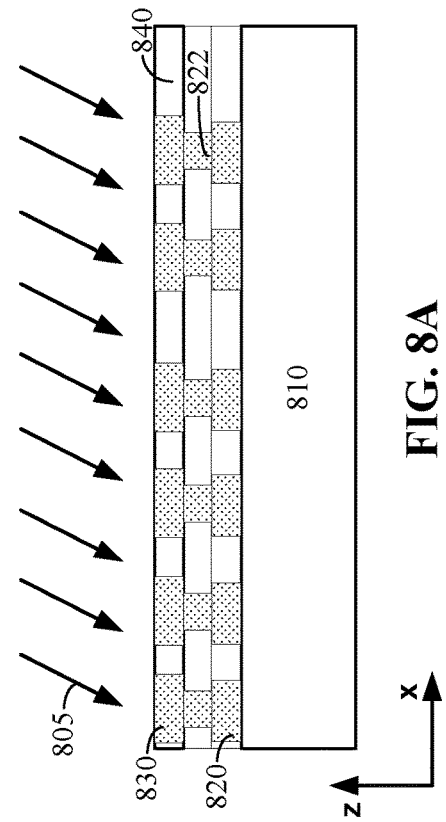
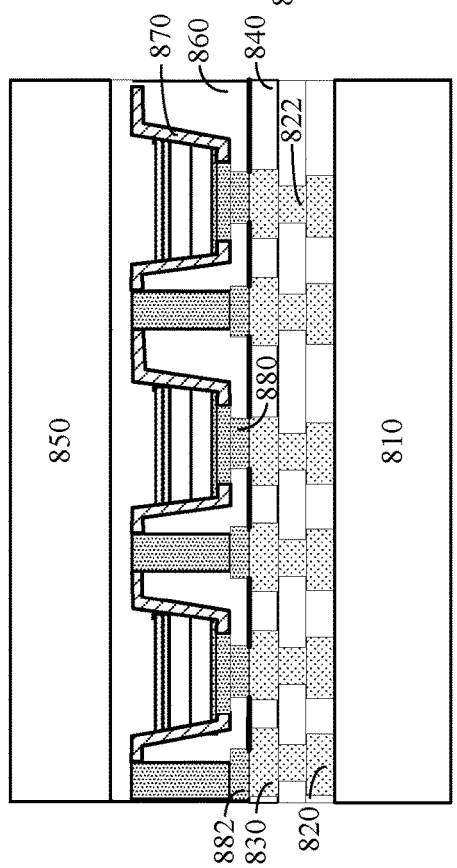
FIG. 8A
FIG. 8B
FIG. 8C
FIG. 8D

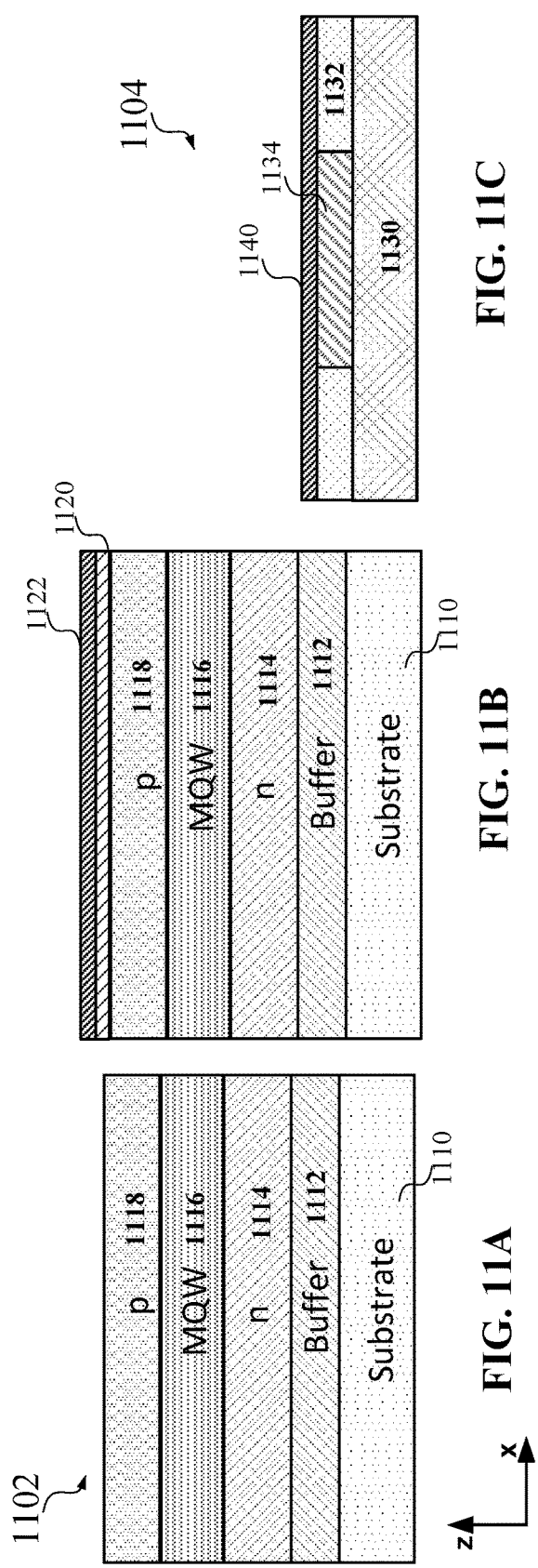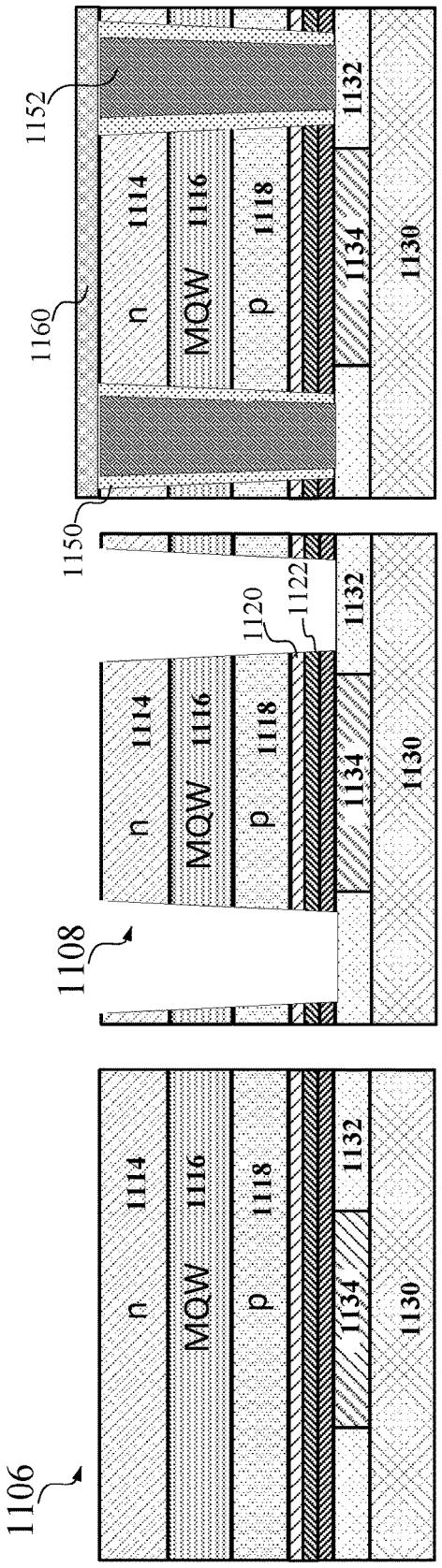
FIG. 11A
FIG. 11B
FIG. 11C
FIG. 11D
FIG. 11E
FIG. 11F

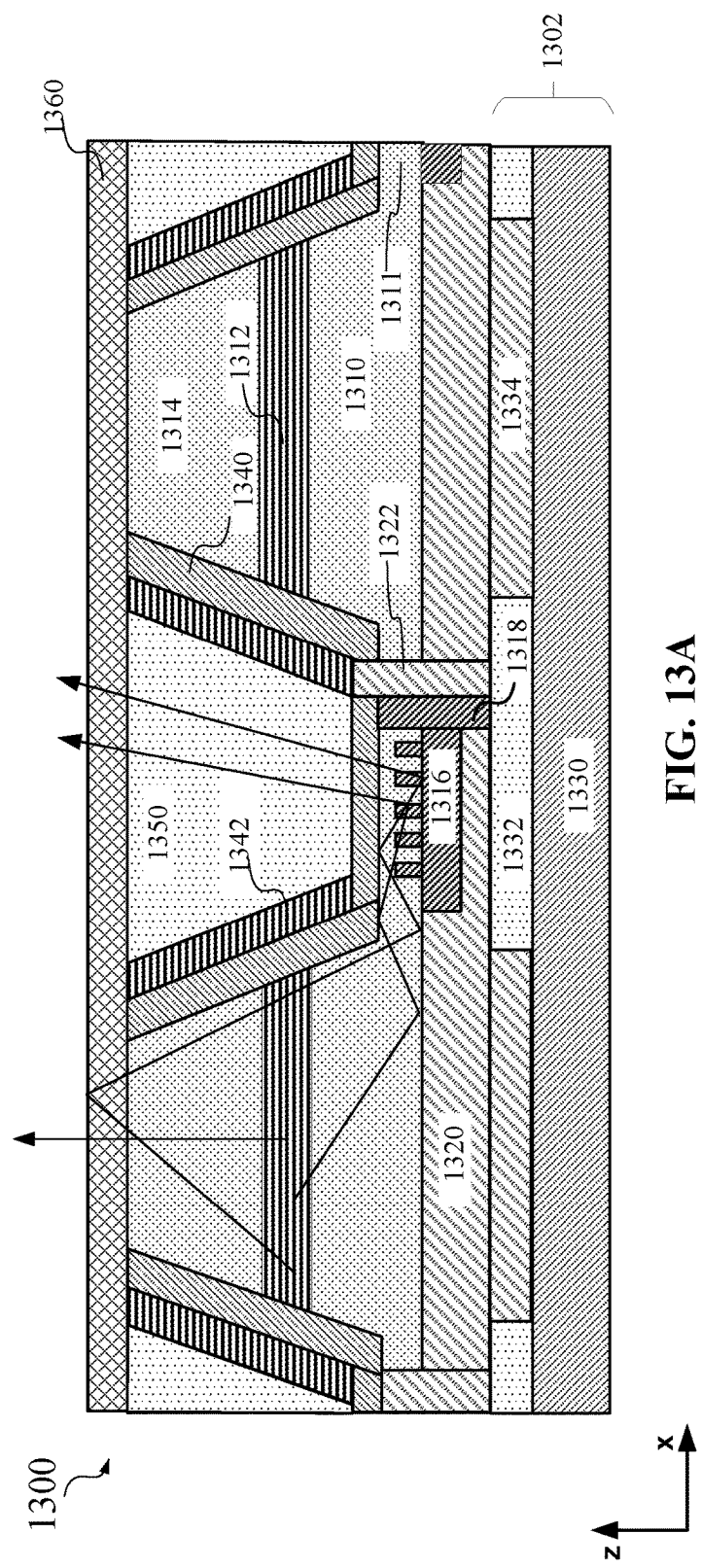
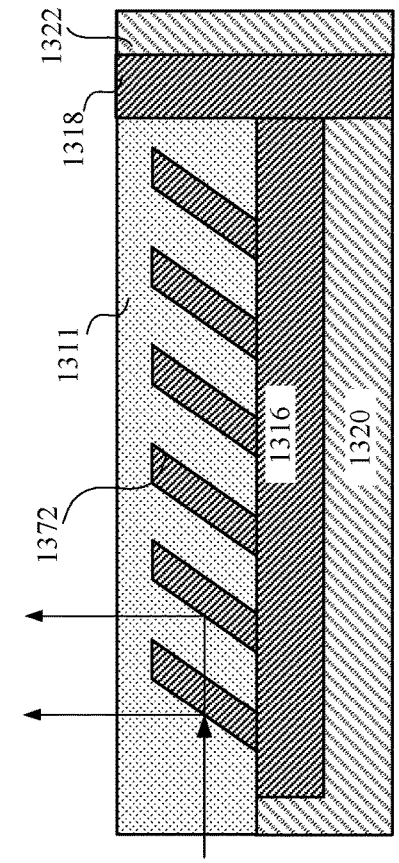
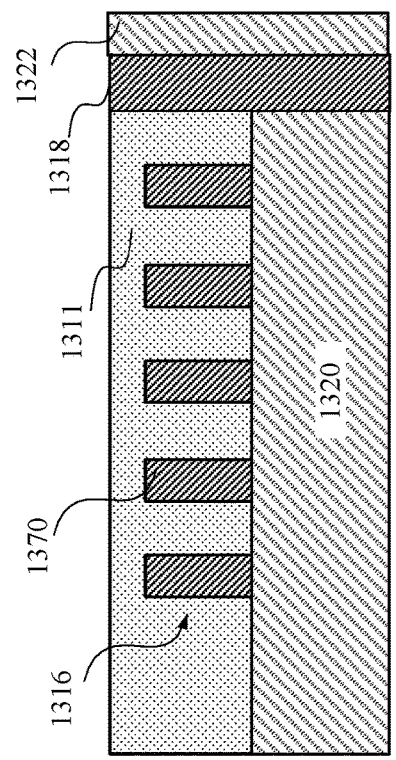
FIG. 13A
FIG. 13B
FIG. 13C

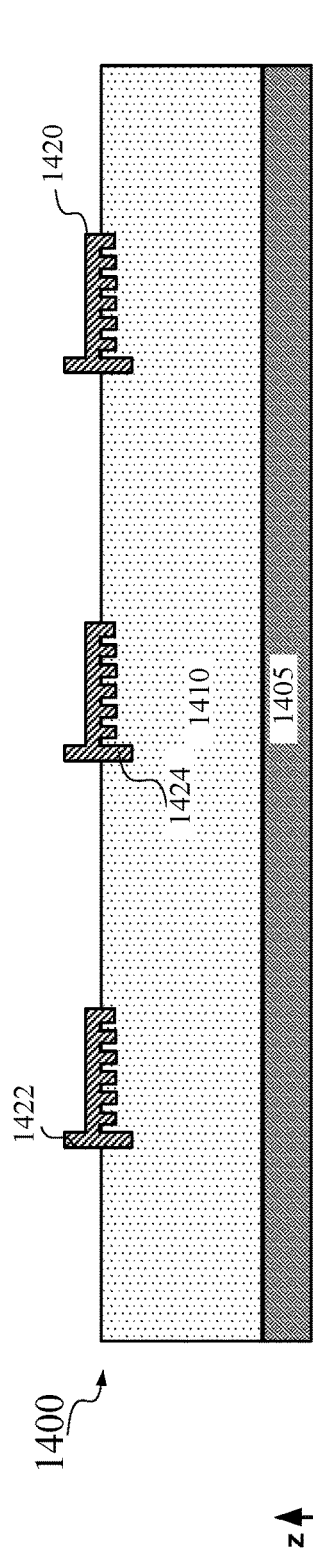
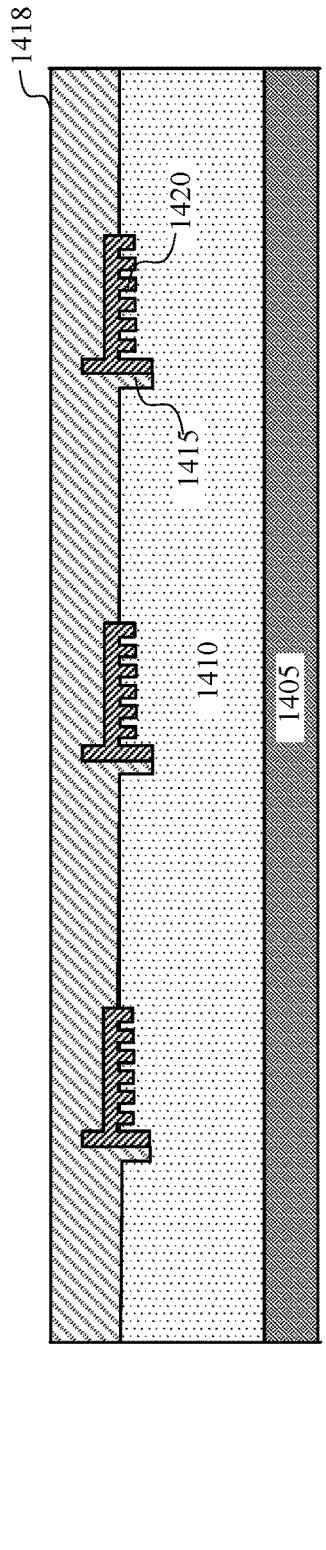
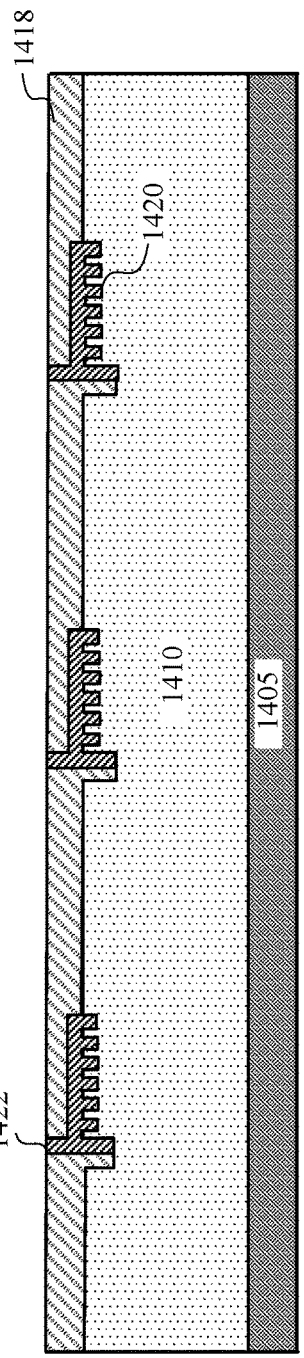
FIG. 14A
FIG. 14B
FIG. 14C

GUIDED LIGHT EXTRACTION IN TRENCHES

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("μLEDs") based on III-V semiconductors, such as alloys of AlN, GaN, InN, AlGaInP, other ternary and quaternary nitride, phosphide, and arsenide compositions, have begun to be developed for various display applications due to their small size (e.g., with a linear dimension less than 100 μm, less than 50 μm, less than 10 μm, or less than 5 μm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro-light emitting diodes (micro-LEDs). More specifically, this disclosure relates to micro-LED devices with grating couplers for improved light extraction efficiencies. Various inventive embodiments are described herein, including devices, systems, methods, processes, materials, and the like.

According to certain embodiments, a micro-LED device includes a backplane wafer including electrical circuits fabricated thereon, a back reflector and contact layer bonded to the backplane wafer and isolated into a plurality of electrodes by a plurality of dielectric structures, a first sublayer of a first semiconductor material coupled to the back reflector and contact layer, a plurality of semiconductor mesa structures on the first sublayer of the first semiconductor material, a passivation layer on sidewalls of the plurality of semiconductor mesa structures, transparent dielectric material regions between semiconductor mesa structures of the plurality of semiconductor mesa structures, and grating couplers in regions of the first sublayer of the first semiconductor material that are aligned with the transparent dielectric material regions. Each semiconductor mesa structure of the plurality of semiconductor mesa structures may include a second sublayer of the first semiconductor material, an active region, and a second semiconductor layer. The regions of the first sublayer of the first semiconductor material are configured to guide light emitted in the active regions of the plurality of semiconductor mesa structures to the grating couplers. The grating couplers are configured to diffract the light guided by the regions of the first sublayer of the first semiconductor material towards the transparent dielectric material regions.

In some embodiments, the micro-LED device includes sidewall reflectors on sidewalls of the passivation layer and between the passivation layer and the transparent dielectric material regions. In some embodiments, the sidewall reflectors are on some but not all sidewalls of the passivation layer. In some embodiments, the micro-LED device may include a transparent conductive layer on the plurality of semiconductor mesa structures and the transparent dielectric material regions. The micro-LED device may also include front reflectors on or in the transparent conductive layer, the front reflectors aligned with the second semiconductor layer of each semiconductor mesa structure of the plurality of semiconductor mesa structures and configured to reflect light incident on the front reflectors.

In some embodiments, the plurality of dielectric structures may electrically isolate the first sublayer of the first semiconductor material into a plurality of regions. The micro-LED device may also include a plurality of optical isolation structures in the regions of the first sublayer of the first semiconductor material, the plurality of optical isolation structures optically isolating the plurality of regions of the first sublayer of the first semiconductor material. In some embodiments, each optical isolation structure of the plurality of optical isolation structures may be adjacent to a respective dielectric structure of the plurality of dielectric structures. In some embodiments, the grating couplers may include straight or slanted grating ridges that have a refractive index different from a refractive index of the first semiconductor material. In some embodiments, the plurality of dielectric structures may be in contact with dielectric material regions of the backplane wafer. In some embodiments, the grating couplers are on or are partially in the back reflector and contact layer.

According to some embodiments, a micro-LED includes a back reflector and contact layer laterally surrounded by a dielectric structure, a first sublayer of a first semiconductor material on the back reflector and contact layer and laterally surrounded by an optical isolation structure, a semiconductor mesa structure in a first lateral region of the micro-LED, an insulator layer on sidewalls of the semiconductor mesa structure, a transparent dielectric material region in a second lateral region of the micro-LED, and a grating coupler in a region of the first sublayer of the first semiconductor material that is aligned with the transparent dielectric material region.

The semiconductor mesa structure may include a second sublayer of the first semiconductor material, an active region, and a second semiconductor layer. The insulator layer may be between the semiconductor mesa structure and the transparent dielectric material region. The region of the first sublayer of the first semiconductor material may be configured to guide light emitted in the active region of the semiconductor mesa structure to the grating coupler. The grating coupler may be configured to diffract the light guided by the region of the first sublayer of the first semiconductor material towards the transparent dielectric material region.

In some embodiments of the micro-LED, the insulator layer may include a passivation layer and a sidewall reflector layer. The sidewall reflector layer may be on some but not all sidewalls of the passivation layer. In some embodiments, the micro-LED may include a transparent conductive layer on the second semiconductor layer of the semiconductor mesa structure and the transparent dielectric material region. In some embodiments, the micro-LED may include a front reflector on or in the transparent conductive layer, the front reflector aligned with the second semiconductor layer of the semiconductor mesa structure and configured to reflect light incident on the front reflector. In some embodiments, the dielectric structure may laterally surround the first sublayer of the first semiconductor material. In some embodiments, the grating coupler may include straight or slanted grating ridges that have a refractive index different from a refractive index of the first semiconductor material. In some embodiments, the grating coupler may be on the back reflector and contact layer or is partially in the back reflector and contact layer. In some embodiments, the dielectric structure may be in contact with a dielectric material region of a backplane wafer, and the back reflector and contact layer may be bonded to a metal contact pad of the backplane wafer.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 5A illustrates an example of a near-eye display device including a waveguide display according to certain embodiments.

FIG. 5B illustrates an example of a near-eye display device including a waveguide display according to certain embodiments.

FIGS. 8A-8D illustrate an example of a method of hybrid bonding for arrays of LEDs according to certain embodiments.

FIGS. 11A-11F illustrate an example of a method of fabricating a micro-LED device using metal-to-metal bonding and post-bonding mesa formation.

FIG. 13A illustrates an example of a micro-LED device according to certain embodiments.

FIGS. 13B and 13C illustrate examples of gratings for coupling light out of the micro-LED device of FIG. 13A according to certain embodiments.

FIGS. 14A-14K illustrate an example of a method of fabricating a micro-LED device according to certain embodiments.

Figure 1:
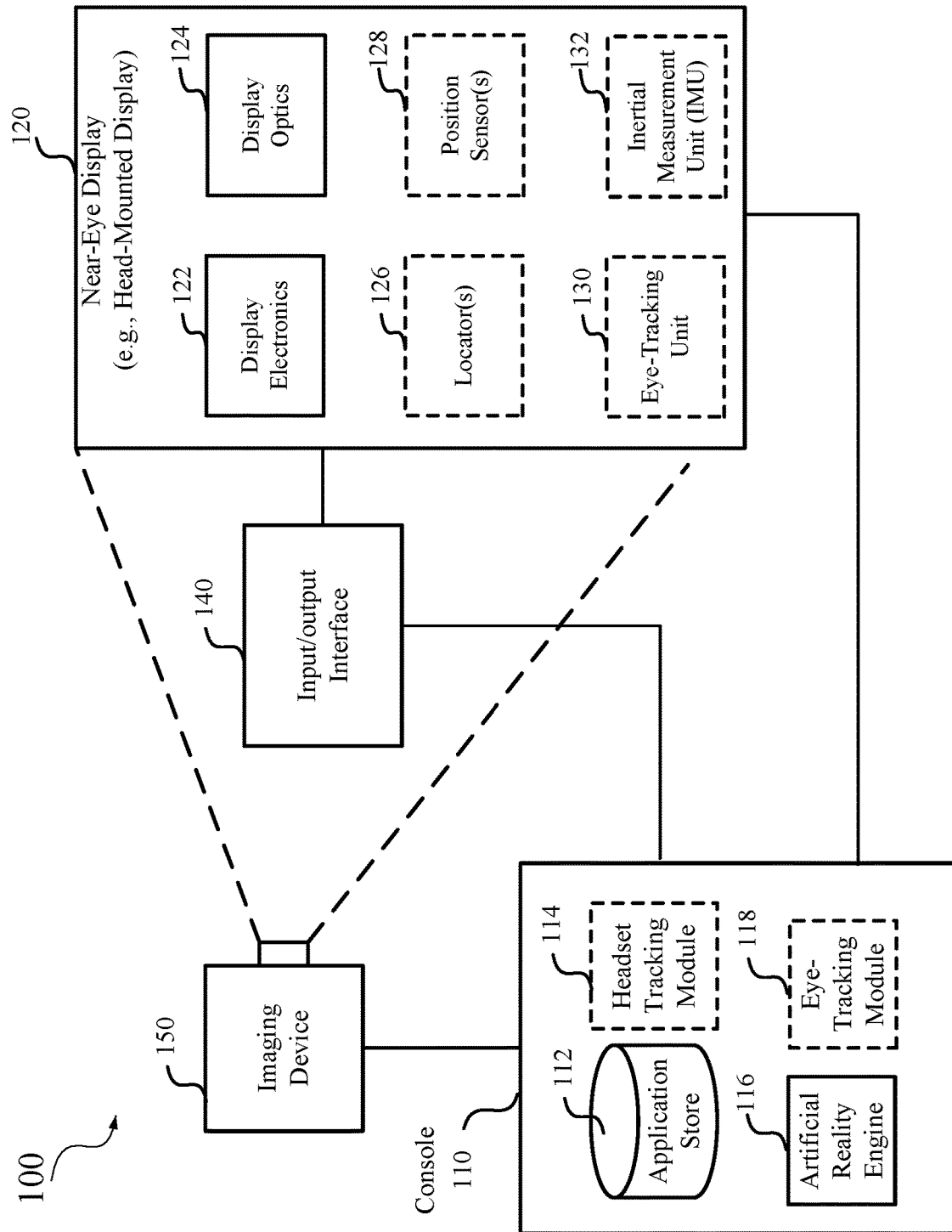
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to micro-light emitting diodes (micro-LEDs). More specifically, this disclosure relates to micro-LED devices with grating couplers for improved light extraction efficiencies. Various inventive embodiments are described herein, including devices, systems, methods, processes, materials, and the like.

Augmented reality (AR) and virtual reality (VR) applications may use near-eye displays that include tiny monochrome light emitters, such as mini- or micro-LEDs. In light emitting diodes (LEDs), photons are generated through the recombination of electrons and holes within an active region (e.g., including one or more semiconductor layers that may form one or more quantum wells). The proportion of carriers (e.g., electrons or holes) injected into the active region of an LED among the carriers that pass through the LED is referred to as the carrier injection efficiency. The ratio between the number of emitted photons and the number of carriers injected into the active region is referred to as the internal quantum efficiency (IQE) of the LED. Light emitted in the active region may be extracted from the LED at a certain light extraction efficiency (LEE). The ratio between the number of emitted photons extracted from the LED and the number of electrons passing through the LED is referred to as the external quantum efficiency (EQE) of the LED, which describes how efficiently the LED converts injected carriers into photons that are extracted from the LED. The EQE may be a product of the carrier injection efficiency, the IQE, and the LEE. In LEDs for ear-eye displays, only light that is emitted from an LED into a certain direction and/or within a certain emission angle range (e.g., within about) ±20° may be collected by the display optics of the near-eye displays. The proportion of the emitted photons that are extracted from the LED and are collected by the display optics may be referred to as the collected LEE. For LEDs with reduced physical dimensions, such as micro-LEDs, the IQEs, collected LEEs, and EQEs may be very low. Improving the efficiencies of the micro-LEDs can be challenging.

The internal quantum efficiency of an LED may depend on the relative rates of competitive radiative (light producing) carrier recombination and non-radiative (lossy) carrier recombination that occur in the active region of the LED. Non-radiative carrier recombination processes in the active region include Shockley-Read-Hall (SRH) recombination at defect sites and electron-electron-hole (eeh) and/or electron-hole-hole (ehh) Auger recombination. The Auger recombination is a non-radiative process involving three carriers, which affects all sizes of LEDs. In micro-LEDs, because the lateral size of each micro-LED may be comparable to the minority carrier diffusion length, a larger proportion of the total active region may be within a distance less than the minority carrier diffusion length from the LED sidewall surfaces where the defect density and the defect-induced non-radiative carrier recombination rate may be high. Therefore, a larger proportion of the injected carriers may diffuse to regions near the sidewall surfaces, where the carriers may be subjected to a higher SRH recombination rate. This may cause the efficiency of the LED to decrease, cause the peak efficiency of the LED to decrease, and/or cause the peak efficiency operating current to increase. Increasing the injected current may cause the efficiencies of the micro-LEDs to drop due to the higher eeh or ehh Auger recombination rate at a higher current density, and may also cause spectral shift of the emitted light. As the physical sizes of LEDs are further reduced, efficiency losses due to surface recombination near the etched sidewall facets that include surface imperfections may become much more significant.

In addition, at the light-emitting surface of an LED, such as the interface between the LED and air, some incident light with incident angles greater than the critical angle may be reflected back to the LED due to total internal reflection (TIR). Because of the geometry of the LED, some light reflected back to the LED may be trapped and eventually be absorbed by the LED. For example, some trapped light may be absorbed by the semiconductor materials to generate electron-hole pairs, which may recombine radiatively or non-radiatively. Some trapped light may be absorbed by metals (e.g., metal contacts or reflectors) at the bottom and/or sidewalls of the LED. In III-phosphide-based LEDs, such as some red light-emitting III-phosphide LEDs, the refractive indices of the III-phosphide semiconductor materials (e.g., GaP, InP, GaInP, or AlGaInP) may be greater than about 3.0 (e.g., about 3.4) for visible light, much higher than the refractive indices of many III-nitride semiconductor materials (e.g., about 2.4 for GaN).

Therefore, the critical angle for total internal reflection at the interface between the III-phosphide semiconductor material and an adjacent lower refractive index material (e.g., air or a dielectric) may be small. As such, more light emitted in the active region of a III-phosphide-based LED may be trapped in the LED and may be absorbed eventually. Therefore, the LEE of a red light-emitting III-phosphide LED may be low. In large LEDs, the light extraction efficiency may be improved using, for example, thin film technology or patterned sapphire substrates with dense, periodic patterns on the substrate surfaces. For example, patterned sapphire substrate techniques may cause light randomization in the semiconductor layer, such that the propagation directions of the photons that may otherwise be trapped in the mesa structure may be randomized to increase the possibility of being released from the confinement and exiting the mesa structure. Therefore, the overall light extraction efficiency may be improved. However, these techniques may not be used in micro-LEDs with linear dimensions less than, for example, about 20 µm, about 10 µm, about 5 µm, about 3 µm, or about 2 µm, due to the small sizes and high aspect ratios (height vs width) of these micro-LEDs.

According to certain embodiments, a micro-LED device may include waveguides and grating couplers in regions of a semiconductor layer between mesa structures of micro-LEDs. Light emitted in the active region of a mesa structure may be coupled into (e.g., reflected) and guided by the waveguide towards a grating coupler and may be coupled out of the micro-LED device through the regions between the mesa structures of micro-LEDs by the grating coupler. The grating coupler may diffract the guided light into certain desired directions, such as directions substantially perpendicular to the light-emitting surface. Therefore, light diffracted by the grating coupler may be incident on the light-emitting surface with small incidence angles, and thus may be refracted into the air, instead of being reflected back into the micro-LED due to total internal reflection. Due to the high directivity of the diffracted light, the light beams coupled out of the micro-LED device may have high directivity and may be more efficiently collected by display optics of a near-eye display system.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to determine the eye's orientation more accurately.

Figure 2:
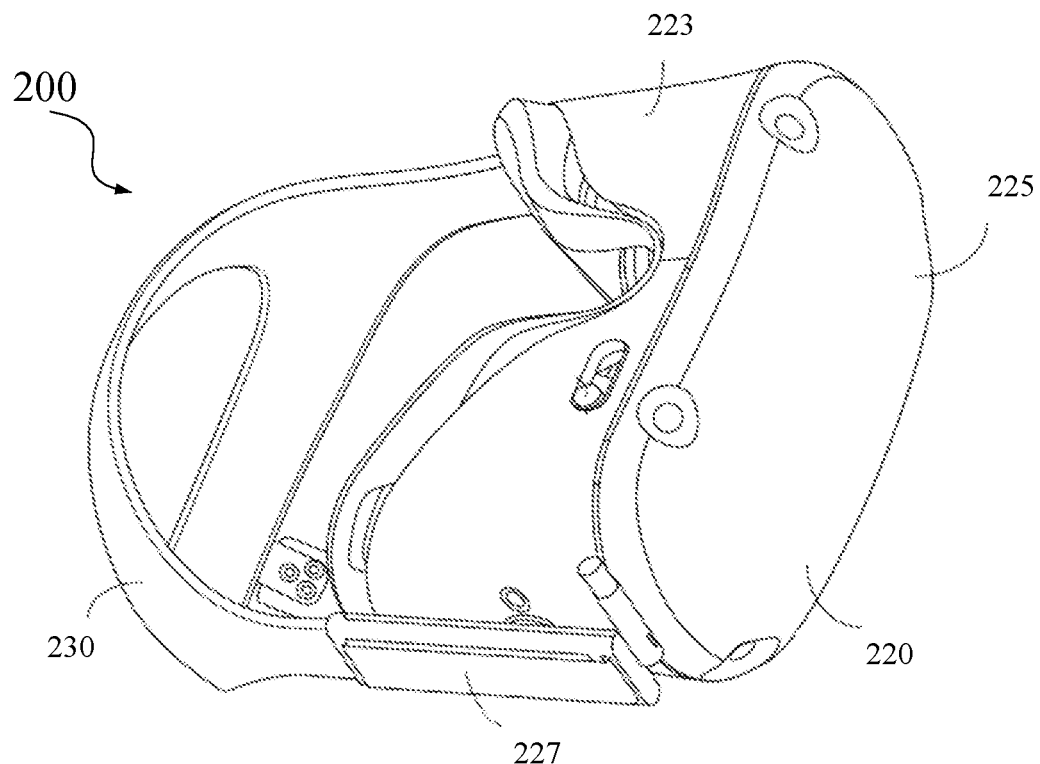
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
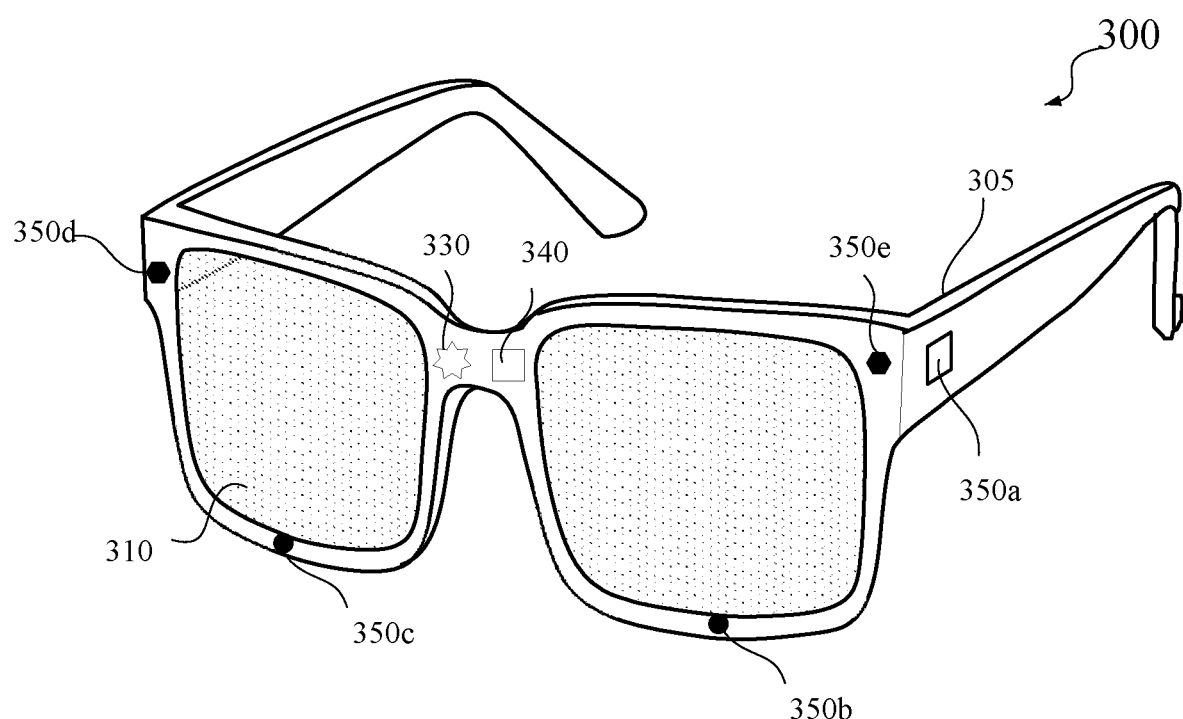
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
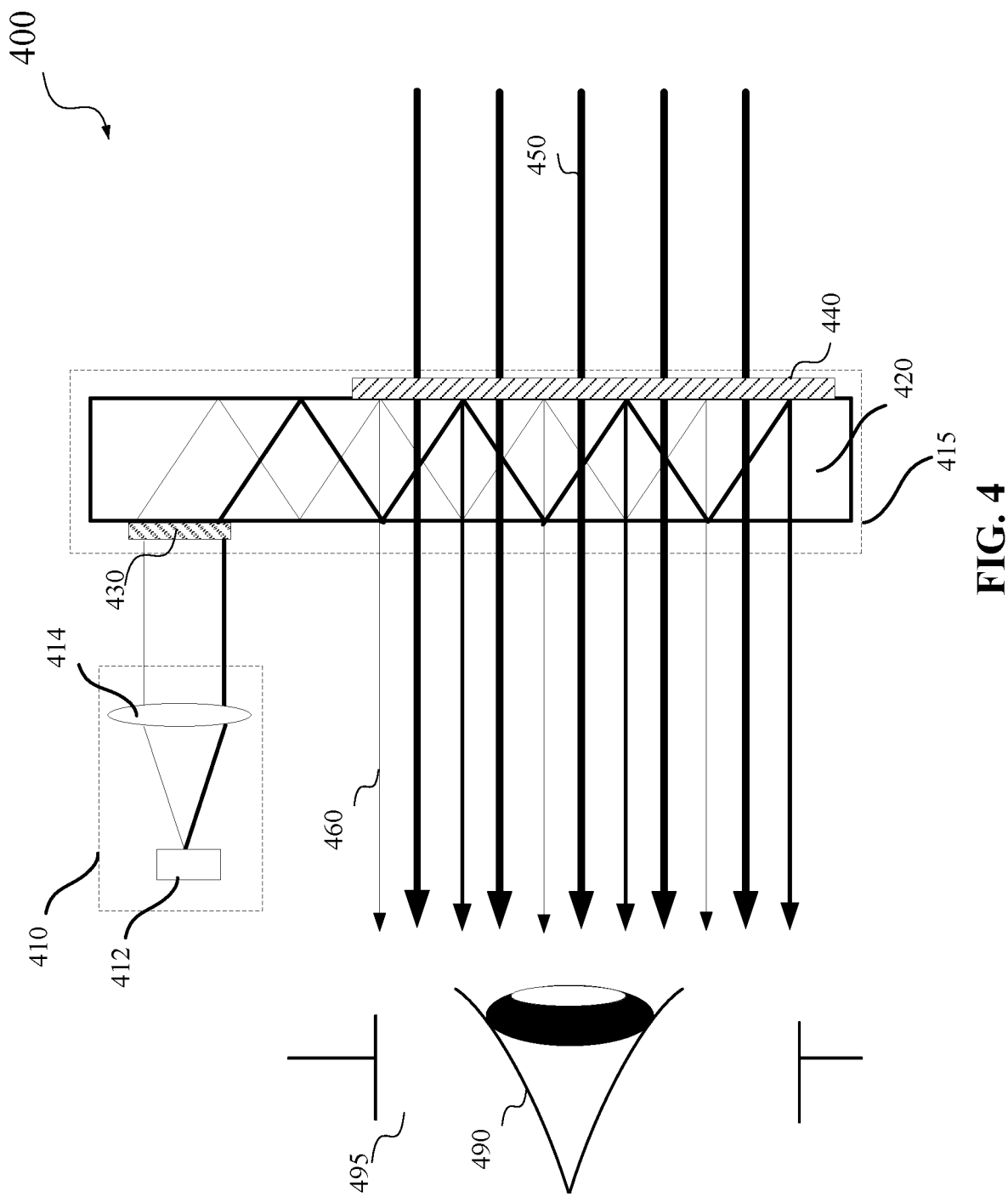
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(m-ethyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
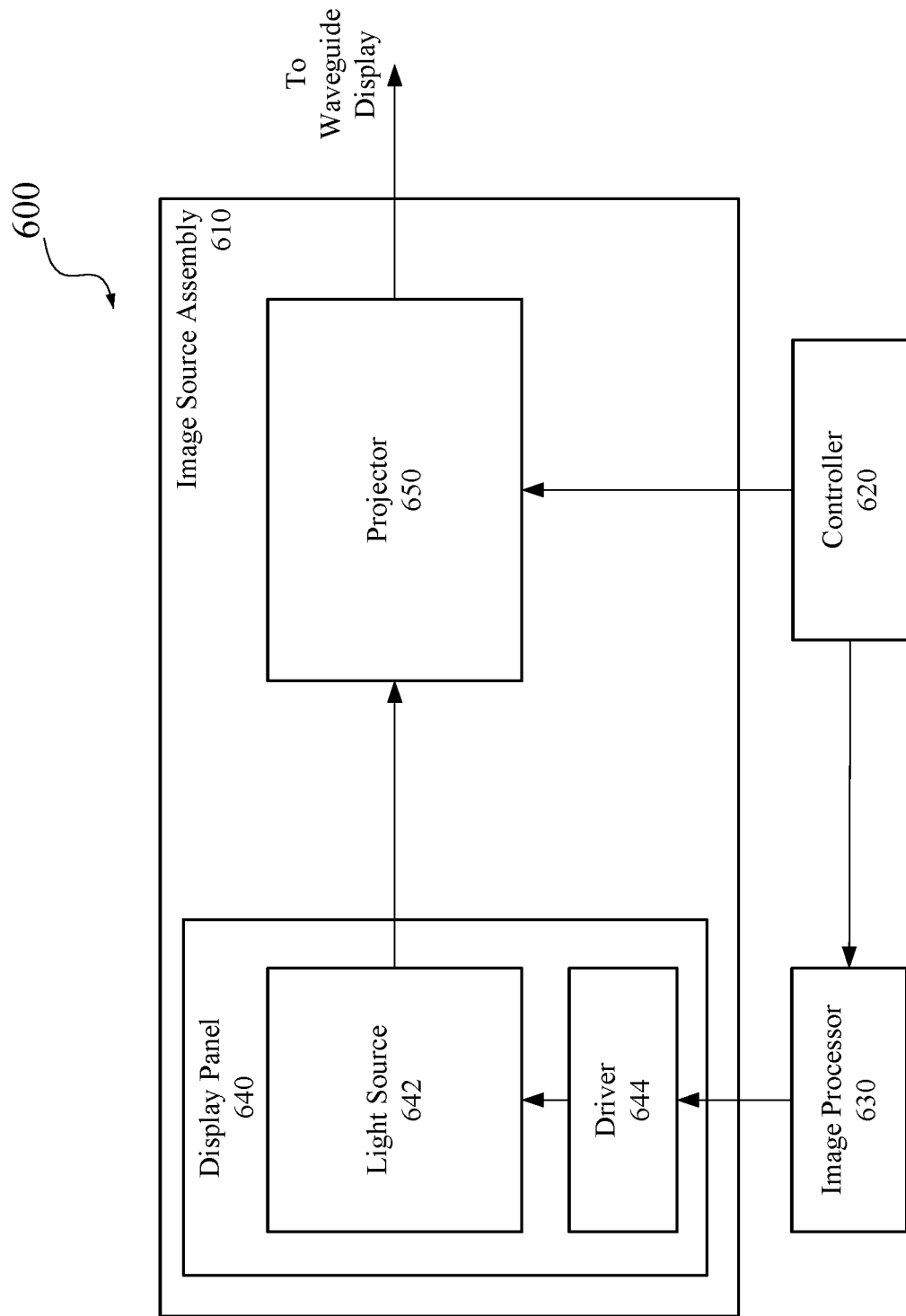
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a drive circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and drive circuit 644, image processor 630 may be a sub-unit of controller 620 or drive circuit 644 in other embodiments. In other words, in those embodiments, controller 620 or drive circuit 644 may perform various image processing functions of image processor 630. Image processor 630 may also be referred to as an image processing circuit.

In the example shown in FIG. 6, light source 642 may be driven by drive circuit 644, based on data or instructions (e.g., display and scanning instructions) sent from controller 620 or image processor 630. In one embodiment, drive circuit 644 may include a circuit panel that connects to and mechanically holds various light emitters of light source 642. Light source 642 may emit light in accordance with one or more illumination parameters that are set by the controller 620 and potentially adjusted by image processor 630 and drive circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
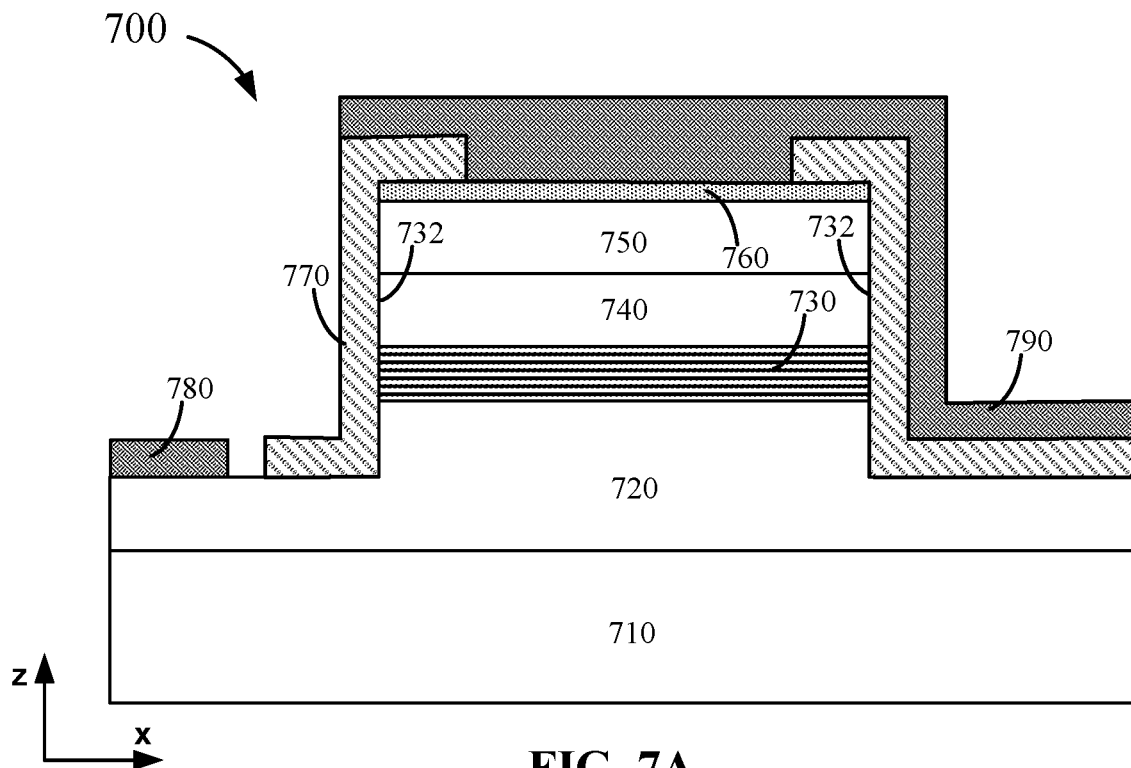
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a P$^+$ or P$^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on mesa sidewalls 732 of the mesa structure. Passivation layer 770 may include an oxide layer, such as a SiO$_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
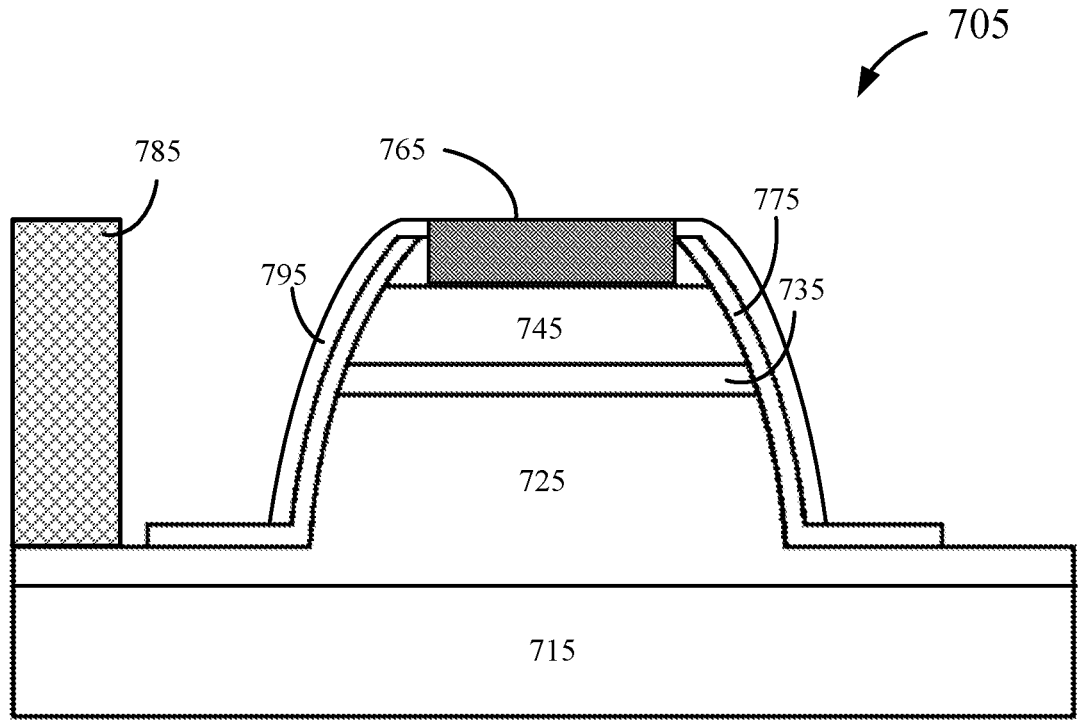
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715.

Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiN) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

One or two-dimensional arrays of the LEDs described above may be manufactured on a wafer to form light sources (e.g., light source 642). Drive circuits (e.g., drive circuit 644) may be fabricated, for example, on a silicon wafer using CMOS processes. The LEDs and the drive circuits on wafers may be diced and then bonded together, or may be bonded on the wafer level and then diced. Various bonding techniques can be used for bonding the LEDs and the drive circuits, such as adhesive bonding, metal-to-metal bonding, metal oxide bonding, wafer-to-wafer bonding, die-to-wafer bonding, hybrid bonding, and the like.

FIGS. 8A-8D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 8A shows a substrate 810 with passive or active circuits 820 manufactured thereon. As described above with respect to FIGS. 8A-8B, substrate 810 may include, for example, a silicon wafer. Circuits 820 may include drive circuits for the arrays of LEDs. A bonding layer may include dielectric regions 840 and contact pads 830 connected to circuits 820 through electrical interconnects 822. Contact pads 830 may include, for example, Cu, Ag, Au, Al, W, Mo, Ni, Ti, Pt, Pd, or the like. Dielectric materials in dielectric regions 840 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 805. The activated surface may be atomically clean and may be reactive for formation of direct bonds between wafers when they are brought into contact, for example, at room temperature.

FIG. 8B illustrates a wafer 850 including an array of micro-LEDs 870 fabricated thereon as described above with respect to, for example, FIGS. 7A-8B. Wafer 850 may be a carrier wafer and may include, for example, GaAs, InP, GaN, AlN, sapphire, SiC, Si, or the like. Micro-LEDs 870 may include an n-type layer, an active region, and a p-type layer epitaxially grown on wafer 850. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 880 and n-contacts 882 may be formed in a dielectric material layer 860 deposited on the mesa structures and may make electrical contacts with the p-type layer and the n-type layers, respectively. Dielectric materials in dielectric material layer 860 may include, for example, SiCN, $SiO_2$, SiN, $Al_2O_3$, $HfO_2$, $ZrO_2$, $Ta_2O_5$, or the like. P-contacts 880 and n-contacts 882 may include, for example, Cu, Ag, Au, Al, W, Mo, Ni, Ti, Pt, Pd, or the like. The top surfaces of p-contacts 880, n-contacts 882, and dielectric material layer 860 may form a bonding layer. The bonding layer may be planarized and polished using, for example, chemical mechanical polishing, where the polishing may cause dishing in p-contacts 880 and n-contacts 882. The bonding layer may then be cleaned and activated by, for example, an ion (e.g., plasma) or fast atom (e.g., Ar) beam 815. The activated surface may be atomically clean and reactive for formation of direct bonds between wafers when they are brought into contact, for example, at room temperature.

FIG. 8C illustrates a room temperature bonding process for bonding the dielectric materials in the bonding layers. For example, after the bonding layer that includes dielectric regions 840 and contact pads 830 and the bonding layer that includes p-contacts 880, n-contacts 882, and dielectric material layer 860 are surface activated, wafer 850 and micro-LEDs 870 may be turned upside down and brought into contact with substrate 810 and the circuits formed thereon. In some embodiments, compression pressure 825 may be applied to substrate 810 and wafer 850 such that the bonding layers are pressed against each other. Due to the surface activation and the dishing in the contacts, dielectric regions 840 and dielectric material layer 860 may be in direct contact because of the surface attractive force, and may react and form chemical bonds between them because the surface atoms may have dangling bonds and may be in unstable energy states after the activation. Thus, the dielectric materials in dielectric regions 840 and dielectric material layer 860 may be bonded together with or without heat treatment or pressure.

FIG. 8D illustrates an annealing process for bonding the contacts in the bonding layers after bonding the dielectric materials in the bonding layers. For example, contact pads 830 and p-contacts 880 or n-contacts 882 may be bonded together by annealing at, for example, about 200-400° C. or higher. During the annealing process, heat 835 may cause the contacts to expand more than the dielectric materials (due to different coefficients of thermal expansion), and thus may close the dishing gaps between the contacts such that contact pads 830 and p-contacts 880 or n-contacts 882 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the drive circuits, the substrate on which the micro-LEDs are fabricated may be thinned or removed, and various secondary optical components may be fabricated on the light-emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 9:
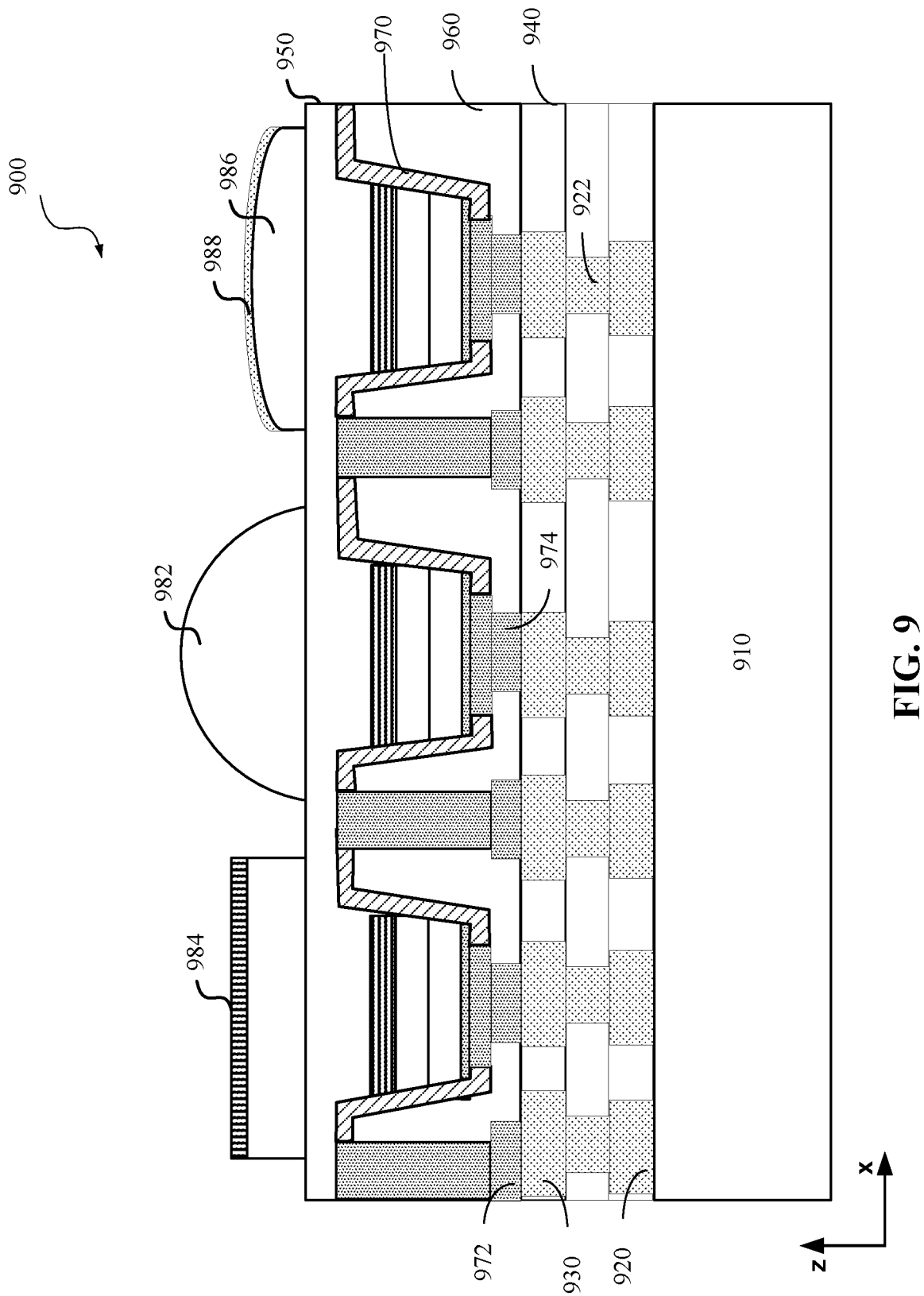
FIG. 9 illustrates an example of an LED array with secondary optical components fabricated thereon according to certain embodiments.

FIG. 9 illustrates an example of an LED array 900 with secondary optical components fabricated thereon according to certain embodiments. LED array 900 may be made by bonding an LED chip or wafer with a silicon wafer including electrical circuits fabricated thereon, using any suitable bonding techniques described above with respect to, for example, FIGS. 8A-8D. In the example shown in FIG. 9, LED array 900 may be bonded using a wafer-to-wafer hybrid bonding technique as described above with respect to FIG. 8A-8D. LED array 900 may include a substrate 910, which may be, for example, a silicon wafer. Integrated circuits 920, such as LED drive circuits, may be fabricated on substrate 910. Integrated circuits 920 may be connected to p-contacts 974 and n-contacts 972 of micro-LEDs 970 through interconnects 922 and contact pads 930, where contact pads 930 may form metallic bonds with p-contacts 974 and n-contacts 972. Dielectric layer 940 on substrate 910 may be bonded to dielectric layer 960 through fusion bonding.

The substrate (not shown) of the LED chip or wafer may be thinned or may be removed to expose the n-type layer 950 of micro-LEDs 970. Various secondary optical components, such as a spherical micro-lens 982, a grating 984, a micro-lens 986, an antireflection layer 988, and the like, may be formed in or on top of n-type layer 950. For example, spherical micro-lens arrays may be etched in the semiconductor materials of micro-LEDs 970 using a gray-scale mask and a photoresist with a linear response to exposure light, or using an etch mask formed by thermal reflowing of a patterned photoresist layer. The secondary optical components may also be etched in a dielectric layer deposited on n-type layer 950 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 970 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 9 to show some examples of secondary optical components that can be formed on micro-LEDs 970, which does not necessary imply that different secondary optical components are used simultaneously for every LED array.

Figures 10A, 10B:
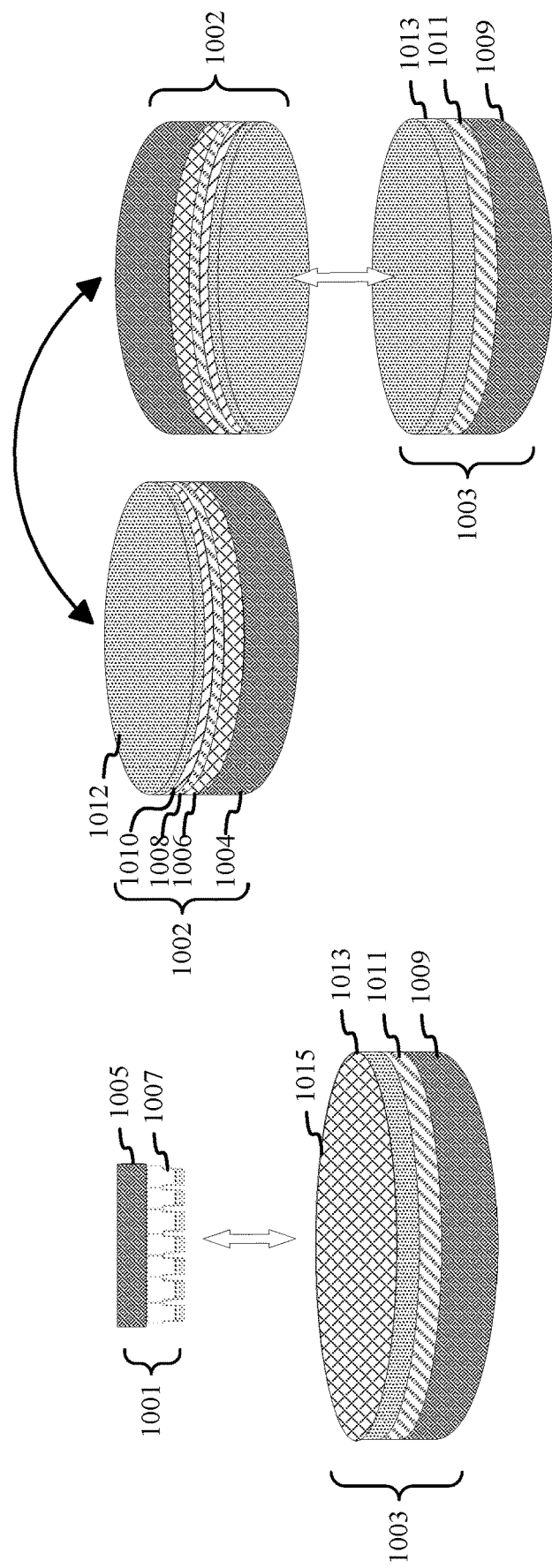
FIG. 10A illustrates an example of a method of die-to-wafer bonding for arrays of LEDs according to certain embodiments.
FIG. 10B illustrates an example of a method of wafer-to-wafer bonding for arrays of LEDs according to certain embodiments.

FIG. 10A illustrates an example of a method of die-to-wafer bonding for arrays of LEDs according to certain embodiments. In the example shown in FIG. 10A, an LED array 1001 may include a plurality of LEDs 1007 on a carrier substrate 1005. Carrier substrate 1005 may include various materials, such as GaAs, InP, GaN, AlN, sapphire, SiC, Si, or the like. LEDs 1007 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 1003 may include a base layer 1009 having passive or active integrated circuits (e.g., drive circuits 1011) fabricated thereon. Base layer 1009 may include, for example, a silicon wafer. Drive circuits 1011 may be used to control the operations of LEDs 1007. For example, the drive circuit for each LED 1007 may include a 2T1C pixel structure that has two transistors and one capacitor. Wafer 1003 may also include a bonding layer 1013. Bonding layer 1013 may include various materials, such as a metal, an oxide, a dielectric, CuSn, AuTi, and the like. In some embodiments, a patterned layer 1015 may be formed on a surface of bonding layer 1013, where patterned layer 1015 may include a metallic grid made of a conductive material, such as Cu, Ag, Au, Al, or the like.

LED array 1001 may be bonded to wafer 1003 via bonding layer 1013 or patterned layer 1015. For example, patterned layer 1015 may include metal pads or bumps made of various materials, such as CuSn, AuSn, or nanoporous Au, that may be used to align LEDs 1007 of LED array 1001 with corresponding drive circuits 1011 on wafer 1003. In one example, LED array 1001 may be brought toward wafer 1003 until LEDs 1007 come into contact with respective metal pads or bumps corresponding to drive circuits 1011. Some or all of LEDs 1007 may be aligned with drive circuits 1011, and may then be bonded to wafer 1003 via patterned layer 1015 by various bonding techniques, such as metal-to-metal bonding. After LEDs 1007 have been bonded to wafer 1003, carrier substrate 1005 may be removed from LEDs 1007.

For high-resolution micro-LED display panel, due to the small pitches of the micro-LED array and the small dimensions of individual micro-LEDs, it can be challenging to electrically connect the drive circuits to the electrodes of the LEDs. For example, in the face-to-face bonding techniques describe above, it is difficult to precisely align the bonding pads on the micro-LED devices with the bonding pads on the drive circuits and form reliable bonding at the interfaces that may include both dielectric materials (e.g., $SiO_2$, SiN, or SiCN) and metal (e.g., Cu, Au, or Al) bonding pads. In particular, when the pitch of the micro-LED device is about 2 or 3 microns or lower, the bonding pads may have a linear dimension less than about 1 µm in order to avoid shorting to adjacent micro-LEDs and to improve bonding strength for the dielectric bonding. However, small bonding pads may be less tolerant to misalignments between the bonding pads, which may reduce the metal bonding area, increase the contact resistance (or may even be an open circuit), and/or cause diffusion of metals to the dielectric materials and the semiconductor materials. Thus, precise alignment of the bonding pads on surfaces of the micro-LED arrays and bonding pads on surfaces of CMOS backplane may be needed in the conventional processes. However, the accuracy of die-to-wafer or wafer-to-wafer bonding alignment using state-of-art equipment may be on the order of about 0.5 µm or about 1 µm, which may not be adequate for bonding the small-pitch micro-LED arrays (e.g., with a linear dimension of the bonding pads on the order of 1 µm or shorter) to CMOS drive circuits.

In some implementations, to avoid precise alignment for the bonding, a micro-LED wafer may be bonded to a CMOS backplane after the epitaxial layer growth and before the formation of individual micro-LED on the micro-LED wafer, where the micro-LED wafer and the CMOS backplane may be bonded through metal-to-metal bonding of two solid metal bonding layers on the two wafers. No alignment would be needed to bond the solid contiguous metal bonding layers. After the bonding, the epitaxial layers on the micro-LED wafer and the metal bonding layers may be etched to form individual micro-LEDs. The etching process may have much higher alignment accuracy and thus may form individual micro-LEDs that align with the underlying pixel drive circuits.

FIG. 10B illustrates an example of a method of wafer-to-wafer bonding for arrays of LEDs according to certain embodiments. As shown in FIG. 10B, a first wafer 1002 may include a substrate 1004, a first semiconductor layer 1006, active layers 1008, and a second semiconductor layer 1010. Substrate 1004 may include various materials, such as GaAs, InP, GaN, AlN, sapphire, SiC, Si, or the like. First semiconductor layer 1006, active layers 1008, and second semiconductor layer 1010 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 1006 may be an n-type layer, and second semiconductor layer 1010 may be a p-type layer. For example, first semiconductor layer 1006 may be an n-doped GaN layer (e.g., doped with Si or Ge), and second semiconductor layer 1010 may be a p-doped GaN layer (e.g., doped with Mg, Ca, Zn, or Be). Active layers 1008 may include, for example, one or more GaN layers, one or more InGaN layers, one or more AlInGaP layers, and the like, which may form one or more heterostructures, such as one or more quantum wells or MQWs.

In some embodiments, first wafer 1002 may also include a bonding layer. Bonding layer 1012 may include various materials, such as a metal, an oxide, a dielectric, CuSn, AuTi, or the like. In one example, bonding layer 1012 may include p-contacts and/or n-contacts (not shown). In some embodiments, other layers may also be included on first wafer 1002, such as a buffer layer between substrate 1004 and first semiconductor layer 1006. The buffer layer may include various materials, such as polycrystalline GaN or AlN. In some embodiments, a contact layer may be between second semiconductor layer 1010 and bonding layer 1012. The contact layer may include any suitable material for providing an electrical contact to second semiconductor layer 1010 and/or first semiconductor layer 1006.

First wafer 1002 may be bonded to wafer 1003 that includes drive circuits 1011 and bonding layer 1013 as described above, via bonding layer 1013 and/or bonding layer 1012. Bonding layer 1012 and bonding layer 1013 may be made of the same material or different materials. Bonding layer 1013 and bonding layer 1012 may be substantially flat. First wafer 1002 may be bonded to wafer 1003 by various methods, such as metal-to-metal bonding, eutectic bonding, metal oxide bonding, anodic bonding, thermo-compression bonding, ultraviolet (UV) bonding, and/or fusion bonding.

As shown in FIG. 10B, first wafer 1002 may be bonded to wafer 1003 with the p-side (e.g., second semiconductor layer 1010) of first wafer 1002 facing down (i.e., toward wafer 1003). After bonding, substrate 1004 may be removed from first wafer 1002, and first wafer 1002 may then be processed from the n-side. The processing may include, for example, the formation of certain mesa shapes for individual LEDs, as well as the formation of optical components corresponding to the individual LEDs.

FIGS. 11A-11F illustrate an example of a method of fabricating a micro-LED device. FIG. 11A shows a micro-LED wafer 1102 including epitaxial layers grown on a substrate 1110. As described above, substrate 1110 may include, for example, a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane (e.g., a c-plane or a semipolar plane) as the growth surface. In some embodiments, a buffer layer 1112 may be formed on substrate 1110 to improve the lattice matching between the growth substrate and the epitaxial layers, thereby reducing stress and defects in the epitaxial layers. The epitaxial layers may include an n-type semiconductor layer 1114 (e.g., e.g., an n-doped GaN, AlInP, or AlGaInP layer), an active region 1116, and a p-type semiconductor layer 1118 (e.g., a p-doped GaN, AlInP, or AlGaInP layer). Active region 1116 may include multiple quantum wells or an MQW formed by quantum well layers (e.g., InGaN layers or GaInP layers) sandwiched by barrier layers (e.g., GaN layers, AlInP layers, or AlGaInP layers) as described above. The epitaxial layers may be grown layer-by-layer on substrate 1110 or buffer layer 1112 using techniques such as VPE, LPE, MBE, or MOCVD. In some embodiments, during the growth of the epitaxial layers, n-type semiconductor layer 1114 may be grown first. P-type semiconductor layer 1118 may be grown after the growth of active region 1116 to avoid contamination of active region 1116 and facilitate activation of the dopants in the p-type semiconductor layer. In some embodiments, the p-type semiconductor layer may be grown before the growth of the active region and the n-type semiconductor layer.

FIG. 11B shows a reflector layer 1120 and a bonding layer 1122 formed on p-type semiconductor layer 1118. Reflector layer 1120 may include, for example, a metal layer such as an aluminum layer, a silver layer, or a metal alloy layer. In some embodiments, reflector layer 1120 may include a distributed Bragg reflector formed by conductive materials (e.g., semiconductor materials or conductive oxides) or including conductive vias. In some embodiments, reflector layer 1120 may include one or more sublayers. Reflector layer 1120 may be formed on p-type semiconductor layer 1118 in a deposition process. Bonding layer 1122 may include a metal layer, such as a titanium layer, a copper layer, an aluminum layer, a gold layer, or a metal alloy layer. In some embodiments, bonding layer 1122 may include a eutectic alloy, such as Au—In, Au—Sn, Au—Ge, or Ag—In. Bonding layer 1122 may be formed on reflector layer 1120 by a deposition process and may include one or more sublayers.

FIG. 11C shows a backplane wafer 1104 that includes a substrate 1130 with electrical circuits formed thereon. The electrical circuits may include digital and analog pixel drive circuits for driving individual micro-LEDs. A plurality of metal pads 1134 (e.g., copper or tungsten pads) may be formed in a dielectric layer 1132 (e.g., including $SiO_2$ or SiN). In some embodiments, each metal pad 1134 may be an electrode (e.g., anode or cathode) for a micro-LED. In some embodiments, pixel drive circuits for each micro-LED may be formed in an area matching the size of a micro-LED (e.g., about 2 μm×2 μm), where the pixel drive circuits and the micro-LED may collectively form a pixel of a micro-LED display panel. Even though FIG. 11C only shows metal pads 1134 formed in one metal layer in one dielectric layer 1132, backplane wafer 1104 may include two or more metal layers formed in dielectric materials and interconnected by, for example, metal vias, as in many CMOS integrated circuits. In some embodiments, a planarization process, such as a chemical mechanical polishing (CMP) process, may be performed to planarize the exposed surfaces of metal pads 1134 and dielectric layer 1132. A bonding layer 1140 may be formed on dielectric layer 1132 and may be in physical and electrical contact with metal pads 1134. As bonding layer 1122, bonding layer 1140 may include a metal layer, such as a titanium layer, a copper layer, an aluminum layer, a gold layer, a metal alloy layer, or a combination thereof. In some embodiments, bonding layer 1140 may include a eutectic alloy. In some embodiments, only one of bonding layer 1140 or bonding layer 1122 may be used.

FIG. 11D shows that micro-LED wafer 1102 and backplane wafer 1104 may be bonded together to form a wafer stack 1106. Micro-LED wafer 1102 and backplane wafer 1104 may be bonded by the metal-to-metal bonding of bonding layer 1122 and bonding layer 1140. The metal-to-metal bonding may be based on chemical bonds between the metal atoms at the surfaces of the metal bonding layers. The metal-to-metal bonding may include, for example, thermocompression bonding, eutectic bonding, or transient liquid phase (TLP) bonding. The metal-to-metal bonding process may include, for example, surface planarization, wafer cleaning (e.g., using plasma or solvents) at room temperatures, and compression and annealing at elevated temperatures, such as about 250° C. or higher, to cause diffusion of atoms. In eutectic bonding, a eutectic alloy including two or more metals and with a eutectic point lower than the melting point of the two or more metals may be used for low-temperature wafer bonding. Because the eutectic alloy may become a liquid at the elevated temperature, eutectic bonding may be less sensitive to surface flatness irregularities, scratches, particles contamination, and the like. After the bonding, buffer layer 1112 and substrate 1110 may be thinned or removed by, for example, etching, back grinding, or laser lifting, to expose n-type semiconductor layer 1114.

FIG. 11E shows that wafer stack 1106 may be etched from the side of the exposed n-type semiconductor layer 1114 to form mesa structures 1108 for individual micro-LEDs. As shown in FIG. 11E, the etching may include etching through n-type semiconductor layer 1114, active region 1116, p-type semiconductor layer 1118, reflector layer 1120, and bonding layers 1122 and 1140, in order to singulate and electrically isolate mesa structures 1108. Thus, each singulated mesa structure 1108 may include n-type semiconductor layer 1114, active region 1116, p-type semiconductor layer 1118, reflector layer 1120, and bonding layers 1122 and 1140. To perform the etching, an etch mask layer may be formed on n-type semiconductor layer 1114. The etch mask layer may be patterned by aligning a photomask with the backplane wafer (e.g., using alignment marks on backplane wafer 1104) such that the patterned etch mask formed in the etch mask layer may align with metal pads 1134. Therefore, regions of the epitaxial layers and bonding layers above metal pads 1134 may not be etched. Dielectric layer 1132 may be used as the etch-stop layer for the etching. Due to the etching from n-type semiconductor layer 1114, semiconductor mesa structure 1108 may have sidewalls that are inwardly tilted in the z direction. In some embodiments, semiconductor mesa structures 1108 may have a conical shape, a parabolic shape, a truncated pyramid shape, or another shape. In some embodiments, after the etching, sidewalls of the etched semiconductor mesa structures 1108 may be treated, for example, using KOH or an acid, to remove regions that may be damaged by high-energy ions during the dry etching.

FIG. 11F shows that a passivation layer 1150 may be formed on sidewalls of mesa structures 1108, and a sidewall reflector layer 1152 may be formed on passivation layer 1150 and in regions between mesa structures 1108. Passivation layer 1150 may include a dielectric layer (e.g., $SiO_2$, SiN, or $Al_2O_3$) or an undoped semiconductor layer. Sidewall reflector layer 1152 may include, for example, a metal (e.g., Al or Cu) or a metal alloy. In some embodiments, gaps between mesa structures 1108 may be filled with a dielectric material and/or a metal. Passivation layer 1150, sidewall reflector layer 1152, and/or the dielectric material may be formed using suitable deposition techniques, such as chemical vapor deposition (CVD), physical vapor deposition (PVD), plasma-enhanced chemical vapor deposition (PECVD), atomic-layer deposition (ALD), laser metal deposition (LMD), or sputtering. In some embodiments, a planarization process may be performed after the deposition of passivation layer 1150, sidewall reflector layer 1152, and/or the dielectric material. A common electrode layer 1160, such as a transparent conductive oxide (TCO) layer (e.g., an ITO layer) or a thin metal layer that may be transparent to light emitted in active region 1116, may be formed on the n-type semiconductor layer 1114 to form n-contacts and a common-cathode for the micro-LEDs.

Figure 12:
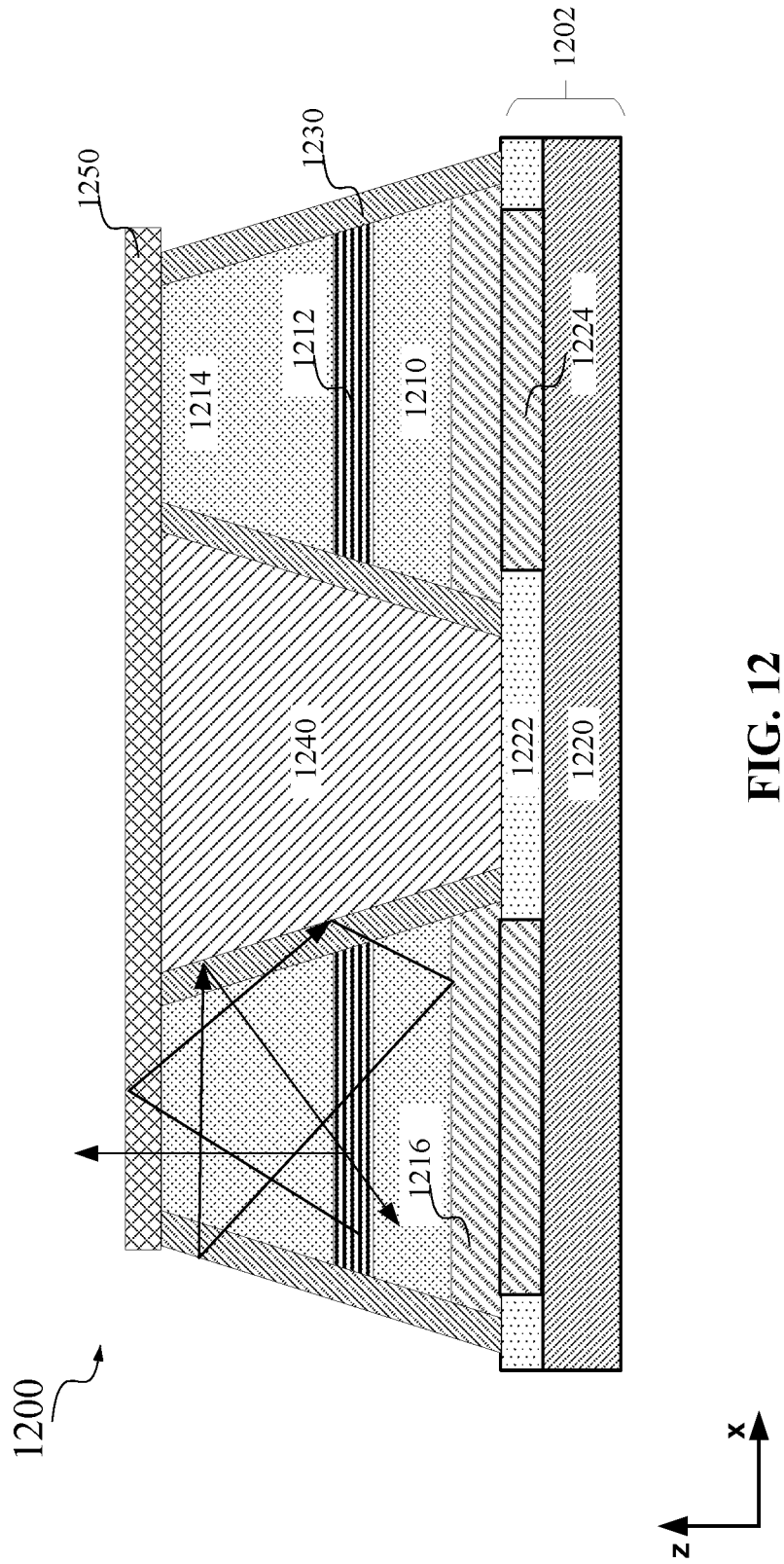
FIG. 12 illustrates an example of a micro-LED device fabricated using the method described with respect to FIGS. 11A-11F.

FIG. 12 illustrates an example of a micro-LED device 1200 fabricated using the process described above with respect to FIGS. 11A-11F. A cross-sectional view of micro-LED device 1200 is shown in FIG. 12. In the illustrated example, micro-LED device 1200 may include a micro-LED wafer bonded to or otherwise formed on a backplane wafer 1202. Backplane wafer 1202 may include a substrate 1220 (e.g., a silicon substrate) including pixel drive circuits formed thereon. The pixel drive circuits may include CMOS circuits, such as CMOS transistors. Backplane wafer 1202 may also include one or more dielectric layers 1222 (e.g., $SiO_2$ layers) and metal interconnects 1224 (e.g., copper or tungsten pads or plugs) formed therein.

The micro-LED wafer may include a substrate and an epitaxial layer stack, and may be bonded to backplane wafer 1202 through a back reflector and contact layer 1216. Back reflector and contact layer 1216 may include, for example, an ITO layer and/or a reflective metal such as Al, Ag, Ni, Au, Cu, or a combination. After the bonding, the substrate of the micro-LED wafer may be removed to expose the epitaxial layer stack, and the epitaxial layer stack may be etched down to back reflector and contact layer 1216 to form an array of mesa structures. Each mesa structure may include a region of back reflector and contact layer 1216, a first (p-doped or n-doped) semiconductor layer 1210, an active region 1212 (e.g., including an MQW), and a second (n-doped or p-doped) semiconductor layer 1214. A passivation layer 1230 may be deposited on sidewalls of the mesa structures to electrically isolate the mesa structures. A sidewall reflector layer 1240 (e.g., including Al, Cu, W, Au, Ti, or a combination) may be formed on passivation layer 1230 and/or in regions between the mesa structures, to form sidewall reflectors that optically isolate individual micro-LEDS. In some embodiments, a metal material (e.g., Al, Cu, W, Au, Ti, or a combination) and/or a dielectric material (e.g., silicon oxide or silicon nitride) may be deposited in regions between the mesa structures. A contact layer 1250 (e.g., a transparent conductive layer, such as an ITO layer) may be formed on the mesa structures after the top surfaces of the mesa structures and sidewall reflector layer 1240 are planarized, for example, using CMP.

Since the mesa structures are formed by etching from the side of second semiconductor layer 1214, each mesa structure may have inwardly tilted mesa sidewalls with respect to the z direction as shown in the illustrated example. Light emitted in active region 1212 may exit the mesa structure directly through second semiconductor layer 1214 and contact layer 1250, or may be reflected by back reflector and contact layer 1216 and/or sidewall reflector layer 1240 and then exit the mesa structure through second semiconductor layer 1214 and contact layer 1250. Light incident on the interface between second semiconductor layer 1214 and contact layer 1250 or incident on the light-emitting surface of the micro-LED (e.g., at the interface between contact layer 1250 and air) with incident angles greater than the critical angle for total internal reflection (TIR) may be reflected back to the mesa structure through total internal reflection. Some light reflected back to the mesa structure may be trapped in the micro-LED and may eventually be absorbed by the micro-LED. For example, some trapped light may be absorbed by the semiconductor materials to generate electron-hole pairs, which may recombine radiatively or non-radiatively. Some trapped light may be absorbed by metals (e.g., metal contacts or reflectors) at the bottom and/or sidewalls of the micro-LED, such as back reflector and contact layer 1216 and sidewall reflector layer 1240, due to, for example, surface plasmon resonance.

In large LEDs, the light extraction efficiency may be improved using, for example, thin film technology or patterned sapphire substrates with dense, periodic patterns on the substrate surfaces. For example, patterned sapphire substrate techniques may cause light randomization in the semiconductor layer, such that the propagation directions of the photons that may otherwise be trapped in the mesa structure may be randomized to increase the possibility of being released from the confinement and exiting the mesa structure. Therefore, the overall light extraction efficiency may be improved. However, these techniques may not be used in micro-LEDs with linear dimensions less than, for example, about 20 μm or about 10 μm, due to the small sizes and high aspect ratios (height vs width) of these micro-LEDs.

In III-phosphide-based LEDs, such as some red light-emitting III-phosphide LEDs, the refractive indices of the III-phosphide semiconductor materials (e.g., GaP, InP, GaInP, or AlGaInP) may be greater than about 3.0 (e.g., about 3.4) for visible light, much higher than the refractive indices of many III-nitride semiconductor materials (e.g., about 2.4 for GaN). Therefore, the critical angle for total internal reflection at the interface between the III-phosphide semiconductor material and an adjacent lower refractive index material (e.g., air, a dielectric, or ITO) may be much smaller than the critical angle for total internal reflection at the interface between a III-nitride semiconductor material and the lower refractive index material. As such, more light emitted in the active region of a III-phosphide-based LED may be trapped in the LED and may be absorbed eventually. Therefore, the LEE of a red light-emitting III-phosphide LED may be very low.

According to certain embodiments, a micro-LED device may include waveguides and grating couplers in regions of a semiconductor layer between mesa structures of micro-LEDs. Light emitted in the active region of a mesa structure may be coupled into (e.g., reflected) and guided by the waveguide towards a grating coupler and may be coupled out of the micro-LED device through the regions between the mesa structures of micro-LEDs by the grating coupler. The grating coupler may diffract the guided light into certain desired directions, such as directions substantially perpendicular to the light-emitting surface. Therefore, light diffracted by the grating coupler may be incident on the light-emitting surface with small incidence angles, and thus may be refracted into the air, instead of being reflected back into the micro-LED due to total internal reflection. Due to the high directivity of the diffracted light, the light beams coupled out of the micro-LED device may have high directivity and may be more efficiently collected by display optics of a near-eye display system.

FIG. 13A illustrates an example of a micro-LED device 1300 according to certain embodiments. A cross-sectional view of micro-LED device 1300 is shown in FIG. 13A. In the illustrated example, micro-LED device 1300 may include an array of micro-LEDs bonded to or otherwise formed on a backplane wafer 1302. Backplane wafer 1302 may include a substrate 1330 (e.g., a silicon substrate) including pixel drive circuits fabricated thereon. The pixel drive circuits may include CMOS digital and analog circuits. Backplane wafer 1302 may also include one or more dielectric layers 1332 (e.g., $SiO_2$ layers) and metal (e.g., copper or tungsten) interconnects 1334 formed therein. The array of micro-LEDs may include a back reflector and contact layer 1320 bonded to backplane wafer 1302. Each micro-LED of the array of micro-LEDs may include a semiconductor mesa structure that includes a portion of a first (n-type or p-type) semiconductor layer 1310, an active region 1312, and a second (p-type or n-type) semiconductor layer 1314. Back reflector and contact layer 1320 may be formed on first semiconductor layer 1310. A passivation layer 1340 (e.g., including $SiO_2$, $Si_3N_4$, or $Al_2O_3$) may be formed on the sidewalls of the semiconductor mesa structure to electrically isolate adjacent micro-LEDs. A sidewall reflector layer 1342 may be deposited on passivation layer 1340. Passivation layer 1340 and sidewall reflector layer 1342 may form an insulator layer for electrical and optical isolation. Regions between the mesa structures may be filled with a transparent dielectric material 1350, such as $SiO_2$. A transparent conductive layer 1360 (e.g., an ITO) layer may be formed on the mesa structures and may be in electrical contact with second semiconductor layer 1314 in each mesa structure. Transparent conductive layer 1360 may be a common anode or a common cathode for the array of micro-LEDs.

First semiconductor layer 1310 may not be fully etched and thus may include a portion 1311 in regions between the mesa structures. The portion of first semiconductor layer 1310 in the regions between the mesa structures may form a waveguide. A grating coupler 1316 may be formed in portion 1311 of first semiconductor layer 1310 and/or back reflector and contact layer 1320. Grating coupler 1316 may include a dielectric material having a refractive index different from the refractive index of first semiconductor layer 1310. Grating coupler 1316 may diffract light guided by the waveguide into substantially the z direction. A dielectric structure 1318 may be formed at one end of portion 1311 of first semiconductor layer 1310 and in back reflector and contact layer 1320 to electrically isolate adjacent micro-LEDs. An optical isolation structure 1322 (e.g., including a metal material of back reflector and contact layer 1320) may be formed at one end of portion 1311 of first semiconductor layer 1310 to optically isolate adjacent micro-LEDs and reduce optical crosstalk between adjacent micro-LEDs. Optical isolation structure 1322 may reflect incident light to grating coupler 1316. A portion of back reflector and contact layer 1320 may be under grating coupler 1316 and may reflect light from grating coupler 1316 back to grating coupler 1316. Grating coupler 1316 may diffract the reflected light to substantially the z direction.

Light emitted in active region 1312 may reach the light-emitting surface of each micro-LED (e.g., the interface between transparent conductive layer 1360 and air) directly or through the reflection by back reflector and contact layer 1320 and/or sidewall reflector layer 1342. At the light-emitting surface of the micro-LED, some incident light with incident angles less than the critical angle for total internal reflection may be refracted to exit the micro-LED, but some incident light with incident angles greater than the critical angle may be reflected back to the LED due to total internal reflection. Some light reflected back to the micro-LED may be reflected by the back reflector and/or the sidewall reflector back to the light-emitting surface. Some light reflected back to the micro-LED may be reflected by the back reflector and the sidewall reflector toward portion 1311 of first semiconductor layer 1310 and may be guided by a waveguide formed by portion 1311 of first semiconductor layer 1310 to propagate horizontally. The guided light may reach grating coupler 1316 and may be diffracted by grating coupler 1316 into a certain diffraction order that propagates in a certain direction or a small range of directions (e.g., in substantially the z direction) towards transparent dielectric material 1350 in regions between the mesa structures. The light diffracted by grating coupler 1316 may be incident on the interface between transparent conductive layer 1360 and air at substantially the surface-normal direction (with small incidence angles), and thus may not be reflected back to the micro-LED due to total internal reflection. Therefore, the light emitted by active region 1312 may eventually be coupled out of the micro-LED device, rather than being trapped within the mesa structures of the micro-LEDs as in micro-LED device 1200. As such, the overall LEE of micro-LED device 1300 may be much higher than that of micro-LED device 1200. In addition, due to the high directivity of the diffracted light, the light beams coupled out of the micro-LED device may have high directivity and may be more efficiently collected by display optics of a near-eye display system.

FIG. 13B illustrates an example of grating coupler 1316 for coupling light out of micro-LED device 1300 of FIG. 13A according to certain embodiments. In the example shown in FIG. 13B, grating coupler 1316 may include a surface-relief grating with straight grating ridges 1370 in portion 1311 of first semiconductor layer 1310. Grating coupler 1316 may include a dielectric material (e.g., $Si_2$, $Si_3N_4$, or $Al_2O_3$) with a refractive index much lower than the refractive index of first semiconductor layer 1310. Grating coupler 1316 may be on or partially in back reflector and contact layer 1320. In some embodiments, gating coupler 1316 may include a variable grating period and/or a variable grating ridge height. Back reflector and contact layer 1320 and/or optical isolation structure 1322 may reflect undiffracted light back to grating coupler 1316, such that the undiffracted light may be diffracted by grating coupler 1316 into substantially the z direction and exit micro-LED device 1300. In some embodiments, grating coupler 1316 may randomize the propagation directions of some incident light such that at least some light may be incident on the light-emitting surface with incidence angles smaller than the critical angle for TIR.

FIG. 13C illustrates an example of grating coupler 1316 for coupling light out of micro-LED device 1300 of FIG. 13A according to certain embodiments. In the example shown in FIG. 13C, grating coupler 1316 may include a surface-relief grating with slanted grating ridges 1372. Grating coupler 1316 may include a dielectric material (e.g., $SiO_2$, $Si_3N_4$, or $Al_2O_3$) with a refractive index much lower than the refractive index of first semiconductor layer 1310. The slant angles of slanted grating ridges 1362 may be selected such that the incident light may be diffracted into substantially the z direction. In some embodiments, grating coupler 1316 may have a variable grating period, a variable slant angle, and/or a variable grating ridge height. Back reflector and contact layer 1320 and/or reflective structure 1322 may reflect undiffracted light back to grating coupler 1316, such that the undiffracted light may be diffracted by grating coupler 1316 into substantially the z direction and exit micro-LED device 1300.

Figures 14D, 14E:
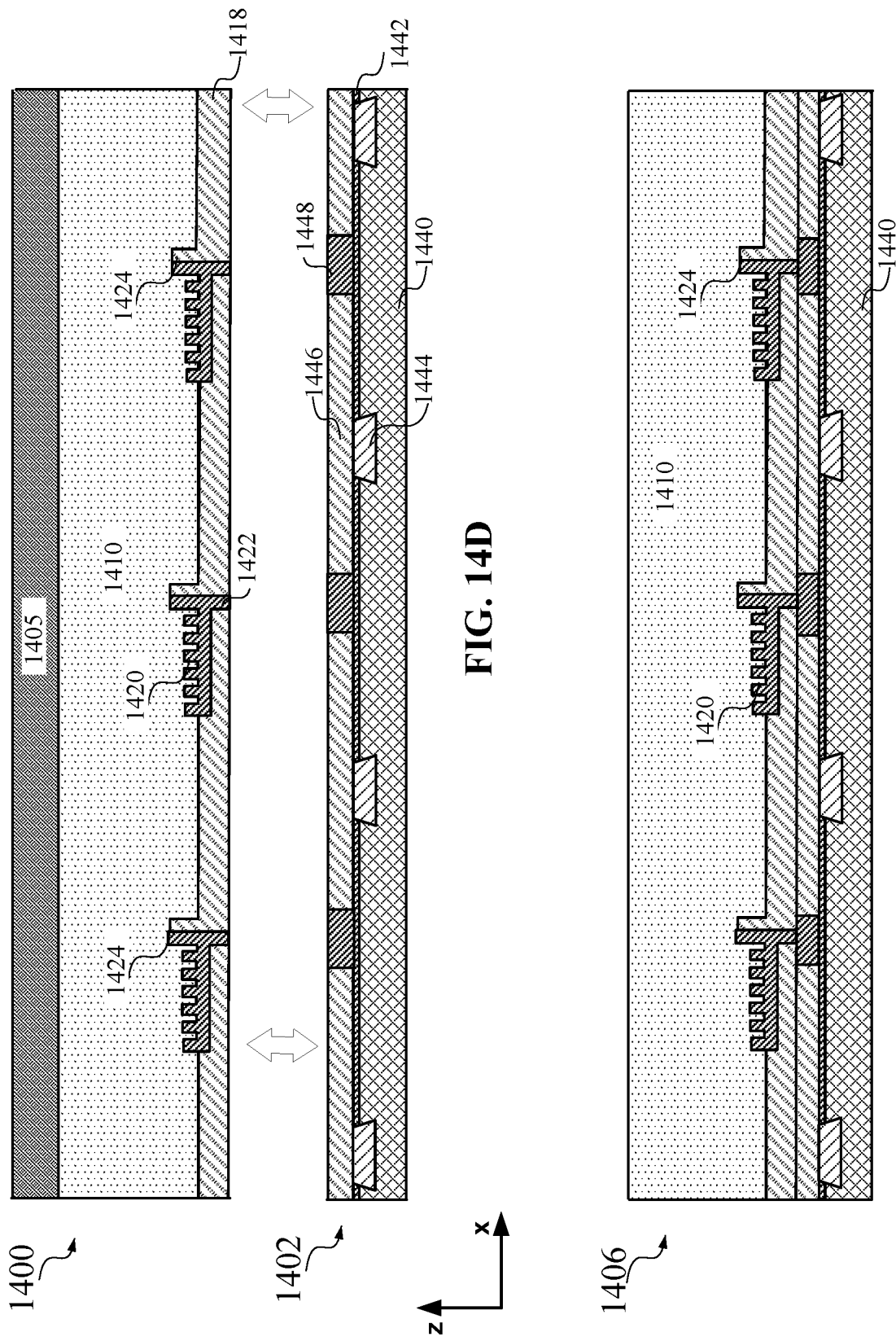

FIGS. 14A-14K illustrate an example of a process of fabricating a micro-LED device (e.g., micro-LED device 1300) according to certain embodiments. FIG. 14A illustrates an example of a micro-LED wafer 1400. Micro-LED wafer 1400 may include a substrate 1405 and an epitaxial layer stack 1410 grown on substrate 1405. Epitaxial layer stack 1410 may include, for example, an n-type semiconductor layer, an active region, and a p-type semiconductor layer as described above with respect to, for example, FIG. 11A. Micro-LED wafer 1400 may be processed from the top side to form grating structures 1420 at the top surface. For example, the top layer of epitaxial layer stack 1410 may be etched in one or more etch processes to form a plurality of trenches. Some trenches may have higher depths than other trenches. A dielectric material layer (e.g., including $SiO_2$, $Si_3N_4$, or $Al_2O_3$) may be deposited on the top surface of epitaxial layer stack 1410. The dielectric material layer may fill the plurality of trenches etched in epitaxial layer stack 1410 to form grating structures 1420 and dielectric structures 1424. The dielectric material layer may also be patterned in one or more etching processes to form certain dielectric structures. For example, a first etch mask may be used to cover the regions of grating structures 1420 and remove the dielectric material layer in other regions, and a second etch mask may be used to etch portions of the remaining dielectric material layer such that portions 1422 of the remaining dielectric material layer may not be etched and may have a higher thickness. In some embodiments, portions 1422 of the dielectric material layer may be formed in a second dielectric material layer deposited after a first dielectric material layer that forms grating structures 1420 is patterned by etching.

FIG. 14B shows that a back reflector and contact layer 1418 may be deposited on the top surface of micro-LED wafer 1400. Back reflector and contact layer 1418 may include, for example, ITO, Al, Ag, Au, Cu, Ti, or a combination, and may cover grating structures 1420. Back reflector and contact layer 1418 may function as n-contacts or p-contacts for individual micro-LEDs to be fabricated in micro-LED wafer 1400. In the example shown in FIG. 14B, back reflector and contact layer 1418 may include portions 1415 that may be inside epitaxial layer stack 1410 and may be used to optically isolate adjacent micro-LEDs. Portions 1415 of back reflector and contact layer 1418 may be formed by, for example, etching epitaxial layer stack 1410 before depositing back reflector and contact layer 1418. FIG. 14C shows that back reflector and contact layer 1418 may be thinned by etching or planarization to expose portions 1422 of the dielectric material layer and form a flat top surface for bonding.

FIG. 14D shows that the processed micro-LED wafer 1400 including grating structures 1420 and planarized back reflector and contact layer 1418 may be flipped and brought close to a backplane wafer 1402 for wafer-level bonding. Backplane wafer 1402 may include drive circuits 1440, one or more dielectric layers 1442, one or more interconnect layers 1444, and a bonding layer 1446. Bonding layer 1446 may be patterned to form bonding pads for individual micro-LEDs that are isolated by dielectric material regions 1448. The wafer-level bonding may include mostly metal-to-metal bonding, using techniques described above, for example, with respect to FIGS. 10A, 10B, and 11D. After the wafer-level bonding, substrate 1405 of micro-LED wafer 1400 may be removed by, for example, etching, back grinding, or laser lifting. FIG. 14E shows a wafer stack 1406 formed after the wafer-level bonding and the substrate removal.

Figure 14F:
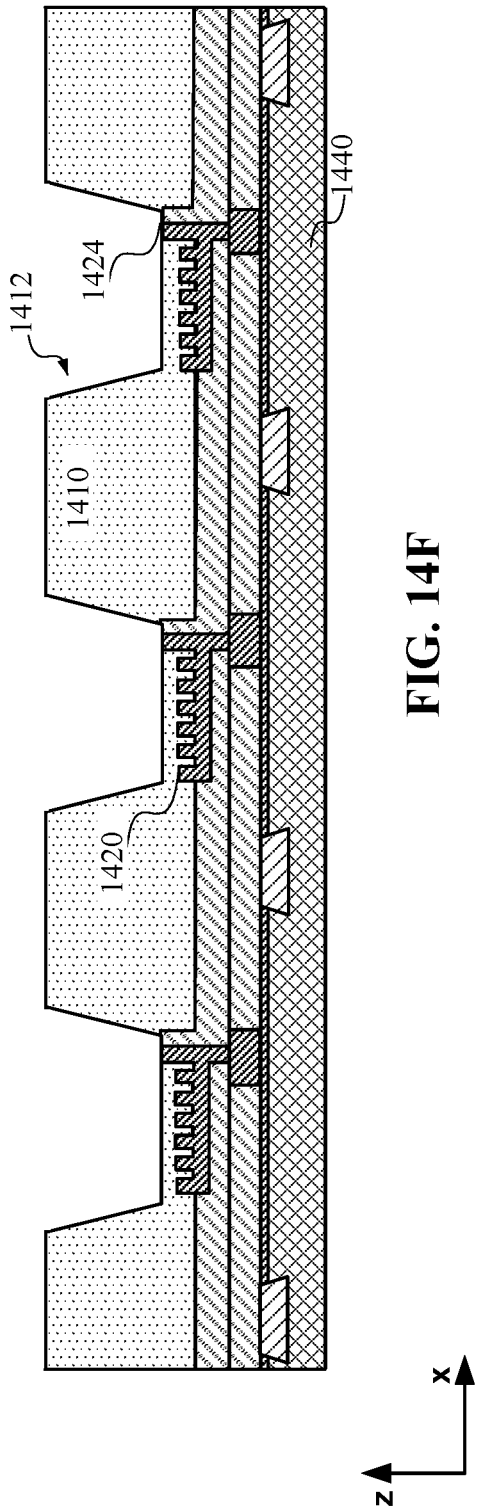

FIG. 14F shows that epitaxial layer stack 1410 may be etched to form individual semiconductor mesa structures 1412. Each semiconductor mesa structure 1412 may have inwardly tilted sidewalls and may include the first semiconductor layer, the active region, and a portion of the second semiconductor layer. As illustrated in FIG. 14F, at least a portion (e.g., the bottom portion that includes p-doped semiconductor or n-doped semiconductor) of epitaxial layer stack 1410 may not be etched, such that there may be a sublayer of the second semiconductor layer (e.g., with a thickness less than about a few hundred nanometers) on grating structures 1420. The thickness of the remaining sublayer of the second semiconductor layer may be controlled by, for example, controlling the etch time. In some embodiments, epitaxial layer stack 1410 may be etched until dielectric structures 1424 are exposed. As described above, after the etching, sidewalls of the etched semiconductor mesa structures 1412 may be treated, for example, using KOH or an acid, to remove regions that may be damaged by high-energy ions during the dry etching.

Figure 14G:
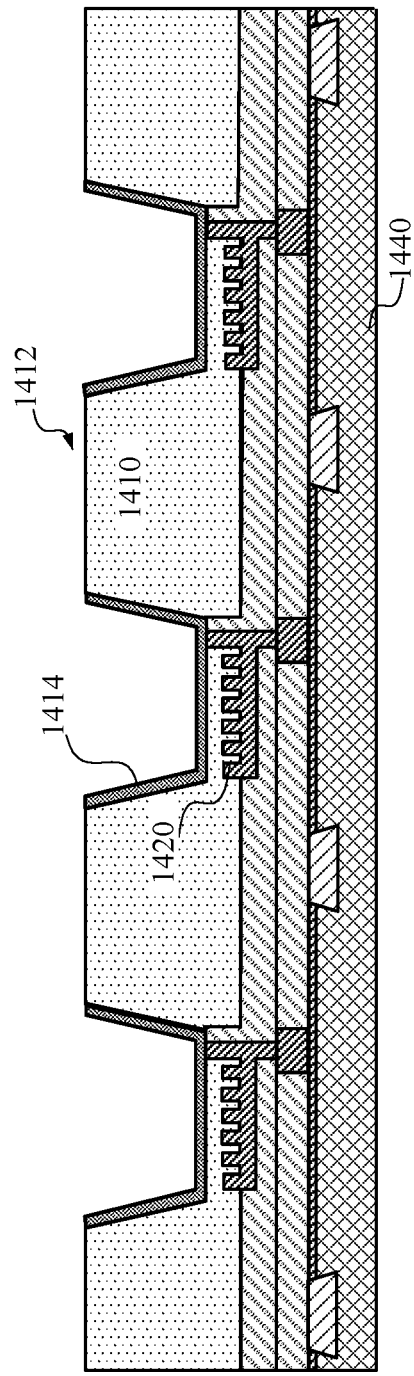

FIG. 14G shows that a passivation layer 1414 may be deposited on exposed surfaces of epitaxial layer stack 1410, including sidewalls of semiconductor mesa structures 1412 and regions between semiconductor mesa structures 1412. Passivation layer 1414 may include a dielectric material such as $SiO_2$, $Si_3N_4$, or $Al_2O_3$, and may have a thickness about tens of nanometers to hundreds of nanometers.

Figure 14H:
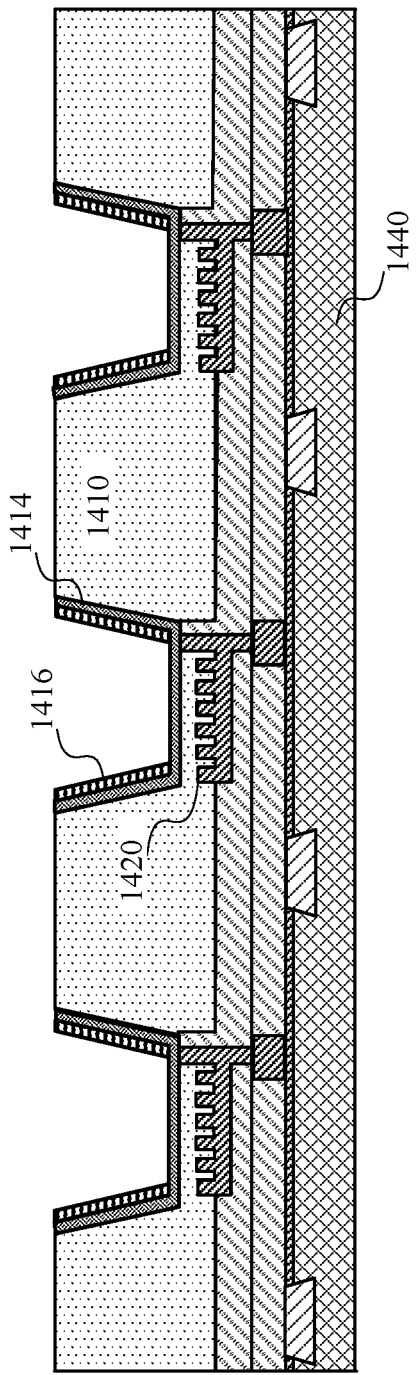
Figure 14I:
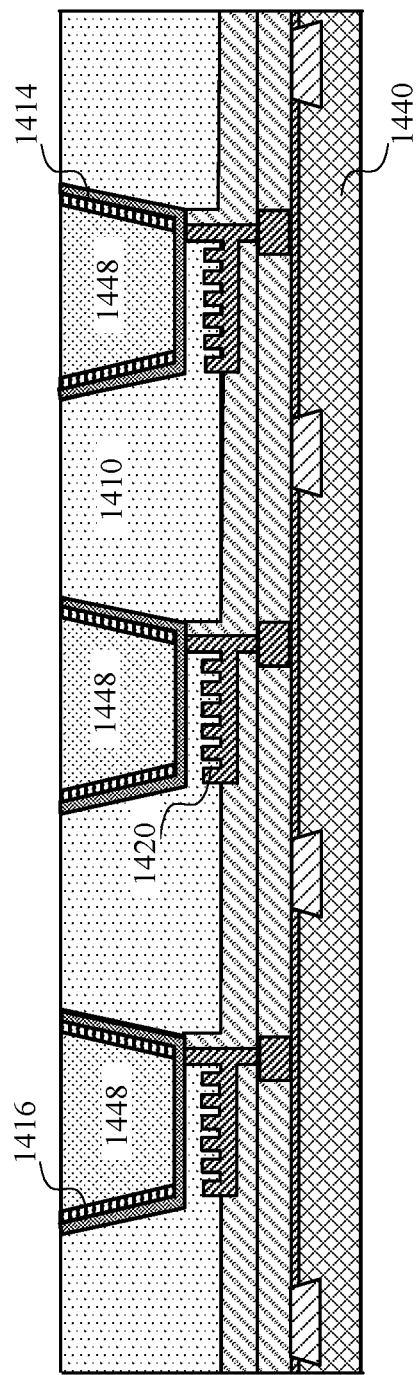

FIG. 14H shows that a reflective metal layer 1416 may be formed on sidewalls of passivation layer 1414. Reflective metal layer 1416 may include, for example, Al, Cu, Ag, Ti, or a combination. Reflective metal layer 1416 may have a thickness between about tens of nanometers and a few hundred nanometers and may function as sidewall reflectors. FIG. 14I shows that a transparent dielectric material 1448 (e.g., $SiO_2$) may be deposited in regions between the semiconductor mesa structures. The top surfaces of transparent dielectric material 1448 and semiconductor mesa structures 1412 may be planarized, for example, using CMP techniques.

Figure 14J:
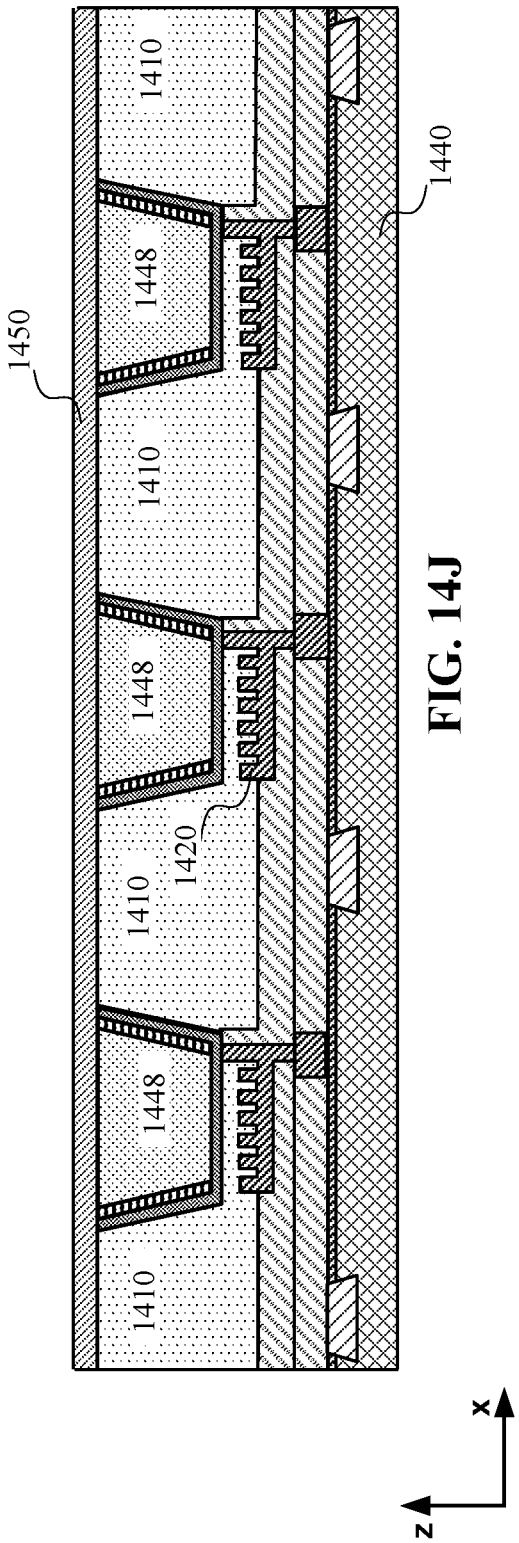

FIG. 14J shows that a transparent conductive layer 1450 (e.g., an ITO layer) may be formed on top of semiconductor mesa structures 1412 and transparent dielectric material 1448. Transparent conductive layer 1450 may be electrically coupled to the first semiconductor layer of each semiconductor mesa structure and may function as a common electrode (e.g., a common anode or a common cathode).

Figure 14K:
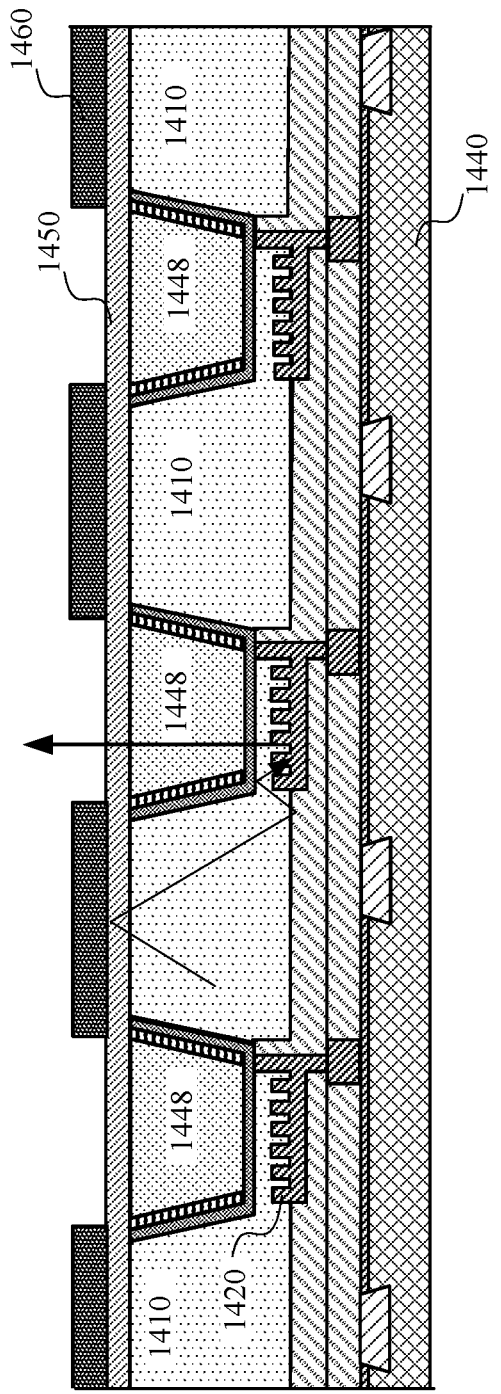

In some embodiments as shown in FIG. 14K, front reflectors 1460 (including a reflective metal layer or reflective coating layers including dielectric materials) may be formed on top of the semiconductor mesa structures such that the light emitted in the active region may only be extracted from regions between the semiconductor mesa structures in substantially the z direction. Reflectors 1460 may be formed on and/or inside transparent conductive layer 1450.

Figure 15A:
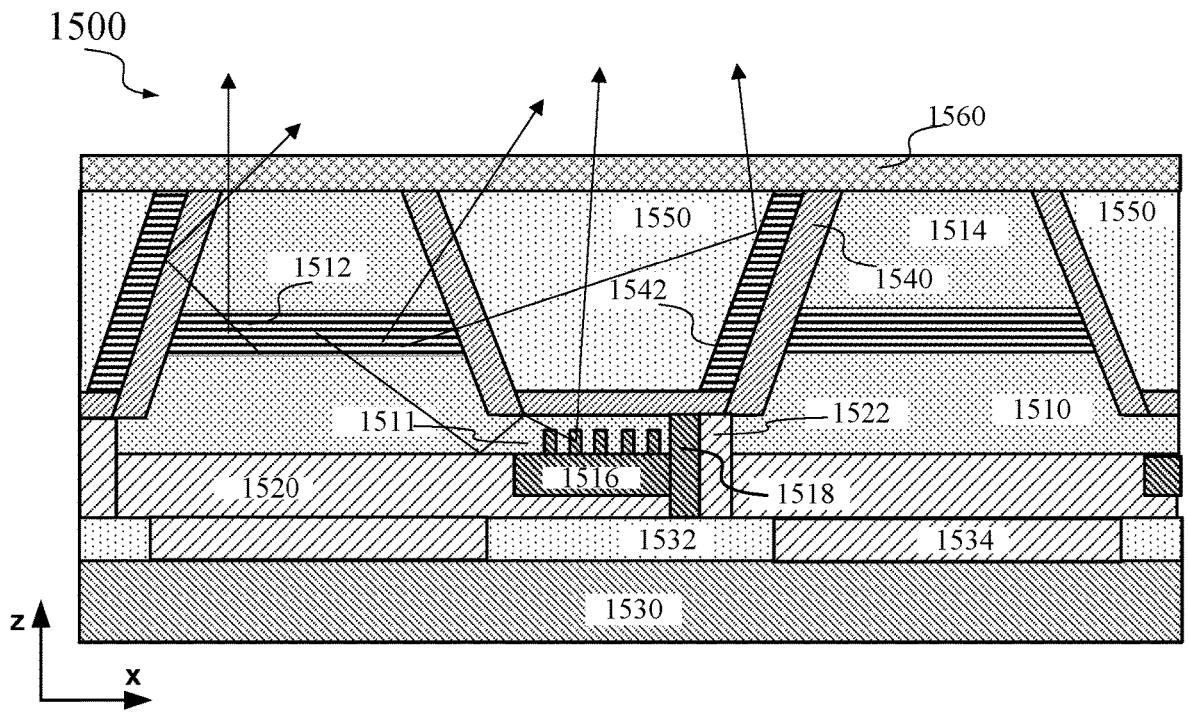
FIG. 15A illustrates an example of a micro-LED device according to certain embodiments.

FIG. 15A illustrates an example of a micro-LED device 1500 according to certain embodiments. Micro-LED device 1500 may be similar to micro-LED device 1300 shown in FIG. 13A and the micro-LED device shown in FIGS. 14J and 14K, and may be fabricated using, for example, the process described above with respect to FIGS. 14A-14K. In the example shown in FIG. 15A, micro-LED device 1500 may include an array of micro-LEDs bonded to or otherwise formed on a backplane wafer. The backplane wafer may include a substrate 1530 (e.g., a silicon substrate) including pixel drive circuits formed thereon. The pixel drive circuits may include CMOS digital and analog circuits. The backplane wafer may also include one or more dielectric layers 1532 (e.g., $SiO_2$ layers) and metal (e.g., copper or tungsten) interconnects 1534 formed therein. The array of micro- LEDs may include a back reflector and contact layer 1520 bonded to the backplane wafer. Each micro-LED of the array of micro-LEDs may include a semiconductor mesa structure that includes a portion of a first (n-type or p-type) semiconductor layer 1510, an active region 1512, and a second (p-type or n-type) semiconductor layer 1514. A passivation layer 1540 (e.g., $SiO_2$, $Si_3N_4$, or $Al_2O_3$) may be formed on sidewalls of the semiconductor mesa structure. A sidewall reflector layer 1542 may be deposited on some but not all sidewall surfaces of passivation layer 1540. Regions between the semiconductor mesa structures may be filled with a transparent dielectric material 1550, such as $SiO_2$. A transparent conductive layer 1560 (e.g., an ITO) layer may be formed on the mesa structures and may be in electrical contact with second semiconductor layer 1514 in each mesa structure. Transparent conductive layer 1560 may be a common anode or a common cathode for the array of micro-LEDs.

First semiconductor layer 1510 may not be fully etched and thus may include a portion 1511 in regions between the semiconductor mesa structures. Portion 1511 of first semiconductor layer 1510 may form a waveguide. A grating coupler 1516 may be formed in portion 1511 of first semiconductor layer 1510 and/or back reflector and contact layer 1520. Grating coupler 1516 may include a dielectric material and may diffract light guided by the waveguide into substantially the z direction. A dielectric structure 1518 may be formed at one end of portion 1511 of first semiconductor layer 1510 and in back reflector and contact layer 1520 to electrically isolate adjacent micro-LEDs. A optical isolation structure 1522 (e.g., including a reflective metal material of back reflector and contact layer 1520) may be formed at one end of portion 1511 of first semiconductor layer 1510 and in back reflector and contact layer 1520 to optically isolate adjacent micro-LEDs and reduce optical crosstalk between adjacent micro-LEDs. A portion of back reflector and contact layer 1520 may be under grating coupler 1516 and may reflect light from grating coupler 1516 back to grating coupler 1516 such that grating coupler 1516 may diffract the reflected light into substantially the z direction.

In micro-LED device 1500, some light emitted in active region 1512 may reach the light-emitting surface of micro-LED device 1500 (e.g., the interface between transparent conductive layer 1560 and air) directly or through reflection(s) by back reflector and contact layer 1520 and/or sidewall reflector layer 1542. Some light emitted in active region 1512 may reach the light-emitting surface through passivation layer 1540 and transparent dielectric material 1550. Some light emitted in active region 1512 may be guided by the waveguide formed by portion 1511 of first semiconductor layer 1510 to propagate horizontally and reach grating coupler 1516, and may then be diffracted by grating coupler 1516 into a certain direction or a small range of directions (e.g., in substantially the z direction) towards transparent dielectric material 1550 in regions between the semiconductor mesa structures. Thus, each micro-LED may have a larger light-emitting surface compared to the example shown in FIG. 14K.

Figure 15B:
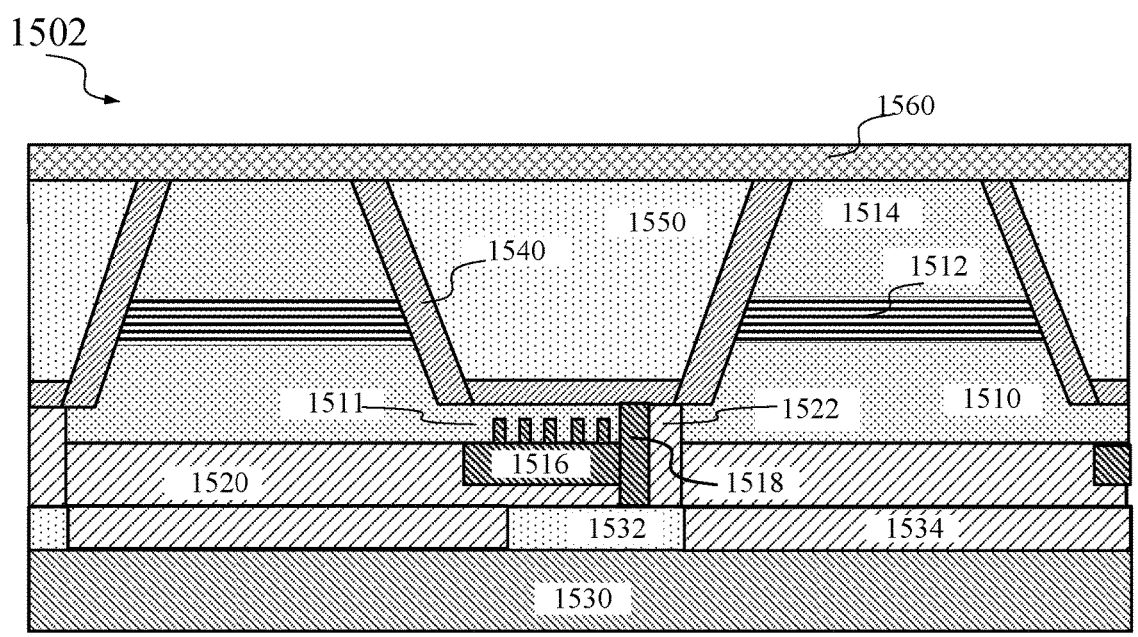
FIG. 15B illustrates yet another example of a micro-LED device according to certain embodiments.

FIG. 15B illustrates yet another example of a micro-LED device 1502 according to certain embodiments. Micro-LED device 1502 may be similar to micro-LED device 1500, but may not include sidewall reflector layer 1542. Micro-LED device 1502 may or may not include optical isolation structure 1522. Micro-LED device 1502 may be used, for example, as a light source for illumination, where light emitted in active regions 1512 of the semiconductor mesa structure may exit micro-LED device 1502 at any region of transparent conductive layer 1560.

Figure 16:
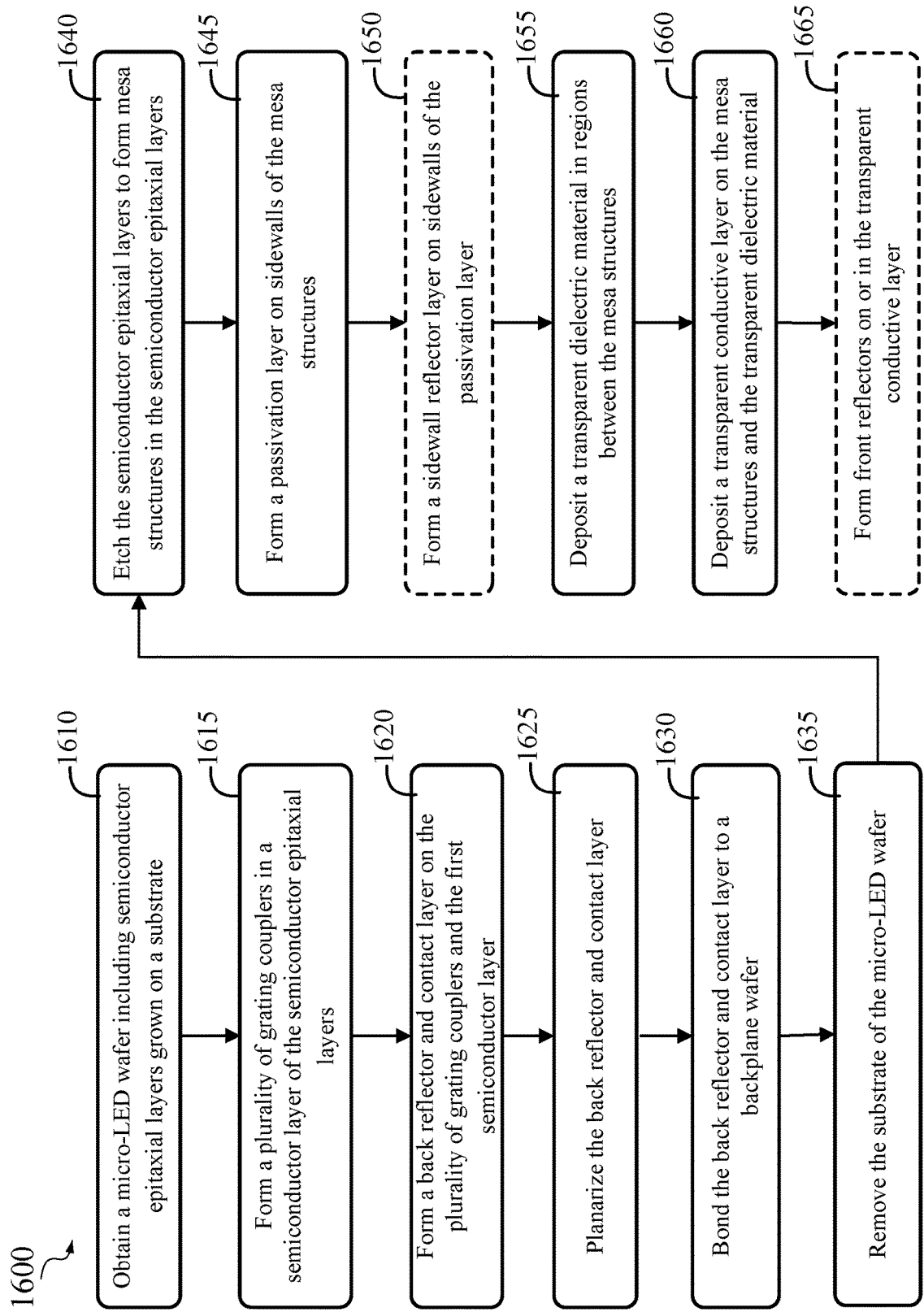
FIG. 16 includes a flowchart illustrating an example of a method of fabricating a micro-LED device with improved light extraction efficiency according to certain embodiments.

FIG. 16 includes a flowchart 1600 illustrating an example of a process of fabricating a micro-LED device according to certain embodiments. It is noted that the specific operations illustrated in FIG. 16 provide a particular process of fabricating a micro-LED device. Other sequences of operations may be performed according to alternative embodiments. Moreover, the individual operations illustrated in FIG. 16 may include multiple sub-steps that may be performed in various sequences as appropriate to the individual operation. Furthermore, additional operations may be added or some operations may not be performed depending on the particular applications. One of ordinary skill in the art would recognize many variations, modifications, and alternatives.

Operations in block 1610 of flowchart 1600 may include obtaining a micro-LED wafer that includes a substrate and a plurality of semiconductor epitaxial layers grown on the substrate as described above with respect to, for example, FIGS. 11A and 14A. The plurality of semiconductor epitaxial layers may include a first semiconductor layer (e.g., an n-type or a p-type semiconductor layer), an active region (e.g., including one or more quantum well layers and two or more quantum barrier layers that form one or more quantum wells), and a second semiconductor layer (e.g., a p-type or an n-type semiconductor layer). The plurality of semiconductor epitaxial layers may be grown on the substrate through, for example, VPE, LPE, MBE, or MOCVD.

Operations in block 1615 may include forming a plurality of grating couplers in a semiconductor layer (e.g., the second semiconductor layer) of the semiconductor epitaxial layers as described above, for example, with respect to FIG. 14A. For example, the second semiconductor layer may be etched to form a plurality of trenches. Some trenches may have higher depths than other trenches. The trenches may be vertical or may be slanted. A dielectric material layer (e.g., including $SiO_2$, $Si_3N_4$, or $Al_2O_3$) may be deposited on the second semiconductor layer and fill the plurality of trenches. The trenches filled with the dielectric material and the second semiconductor layer may form grating couplers. The dielectric material in trenches with higher depths may be used to electrically isolate the second semiconductor layer in adjacent micro-LEDs. The dielectric material layer may be patterned by one or more etching processes to form a plurality of dielectric structures that may be used to isolate electrodes of micro-LEDs in the micro-LED device.

Operations in block 1620 may include forming a back reflector and contact layer (e.g., back reflector and contact layer 1418) on the plurality of grating couplers and the first semiconductor layer as described above, for example, with respect to FIG. 14B. The back reflector and contact layer may include, for example, ITO, Al, Ag, Au, Cu, Ti, or a combination, and may cover the grating couplers and the dielectric structures. The back reflector and contact layer may function as anodes or cathodes for individual micro-LEDs. In some embodiments, regions of the second semiconductor layer may be etched before depositing the back reflector and contact layer, such that the back reflector and contact layer may include portions that may be inside the second semiconductor layer and may be used to optically isolate adjacent micro-LEDs.

Operations in block 1625 may include planarizing the back reflector and contact layer to expose the dielectric structures and form a flat top surface as described above, for example, with respect to FIG. 14C. The back reflector and contact layer may be planarized by, for example, CMP. The flat top surface of the back reflector and contact layer may be treated (e.g., cleaned and activated) for bonding. The dielectric structures may isolate regions of the back reflector and contact layer to form anodes or cathodes for individual micro-LEDs.

Operations in block 1630 may include bonding the back reflector and contact layer to a backplane wafer as described above, for example, with respect to FIG. 14D. The backplane wafer may include drive circuits, one or more interconnect layers, and a bonding layer that includes bonding pads isolated by dielectric material regions. The bonding may include bonding the bonding pads on the backplane wafer to the isolated regions of the backplane reflector and contact layer of the micro-LED wafer such that the micro-LEDs may be individually controlled by the drive circuits of the backplane wafer through the bonding pads and the isolated regions of the backplane reflector and contact layer.

Operations in block 1635 may include removing the substrate of the micro-LED wafer by, for example, etching, back grinding, or laser lifting, as described above with respect to, for example, FIG. 14E. Removing the substrate of the micro-LED wafer may expose the first semiconductor layer (e.g., the n-type or p-type semiconductor layer) grown on the substrate.

Operations in block 1640 may include etching the semiconductor epitaxial layers from the side of the exposed first semiconductor layer to form mesa structures in the semiconductor epitaxial layers as described above with respect to, for example, FIG. 14F. The mesa structures may be in regions of the semiconductor epitaxial layers with no grating couplers underneath the regions. Each semiconductor mesa structure may include the first semiconductor layer, the active region, and a portion (e.g., a sublayer) of the second semiconductor layer. At least a portion (e.g., the bottom portion) of the second semiconductor layer may not be etched, such that there may be a sublayer of the second semiconductor layer (e.g., with a thickness below about a few hundred nanometers) on the grating couplers. In some embodiments, the semiconductor epitaxial layers may be etched for a predetermined time period to achieve the desired thickness of the sublayer of the second semiconductor layer. In some embodiments, the semiconductor epitaxial layers may be etched until the dielectric material filling the trenches in the second semiconductor layer is exposed. In some embodiments, after the etching, sidewalls of the mesa structures may be treated, for example, using KOH or an acid, to remove regions that may be damaged by high-energy ions during the dry etching.

Operations in block 1645 may include forming a passivation layer on sidewalls of the mesa structures as described above with respect to, for example, FIG. 14G. The passivation layer may be conformally deposited on sidewalls of the mesa structure, and may include a dielectric material such as $SiO_2$, $Si_3N_4$, or $Al_2O_3$. The passivation layer may have a thickness about tens of nanometers to hundreds of nanometers. In some embodiments, the passivation layer may also be deposited on surfaces in regions between the mesa structures.

Optional operations in block 1650 may include forming a sidewall reflector layer on sidewalls of the passivation layer as described above with respect to, for example, FIG. 14H. The sidewall reflector layer may include, for example, Al, Cu, Ag, Ti, or a combination. The sidewall reflector layer may have a thickness between about tens of nanometers and a few hundred nanometers. In some embodiments, the sidewall reflector layer may be formed on some but not all sidewalls of the passivation layer as shown in, for example, FIG. 15A.

Operations in block 1655 may include depositing a transparent dielectric material (e.g., $SiO_2$) to fill regions between the mesa structures. The deposited transparent dielectric material may be planarized to form a flat top surface as described above with respect to, for example, FIG. 14I. The remaining transparent dielectric material may be on top of the grating couplers formed in the second semiconductor layer.

Operations in block 1660 may include forming a transparent conductive layer (e.g., ITO layer) on the planarized top surfaces of the mesa structures and the transparent dielectric material as described above with respect to, for example, FIG. 14J. The transparent conductive layer may be electrically coupled to the first semiconductor layer of each mesa structure and may be used as a common electrode (e.g., a common anode or a common cathode) of the micro-LEDs.

Optional operations in block 1665 may include forming front reflectors on or in the transparent conductive layer as described above with respect to, for example, FIG. 14K. The front reflectors may align with the first semiconductor layer of the mesa structures, such that the light emitted in the active region may not be extracted from the first semiconductor layer of the mesa structures, and may only be extracted in substantially the surface-normal direction through the transparent dielectric material in regions between the mesa structures by the grating couplers.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 17:
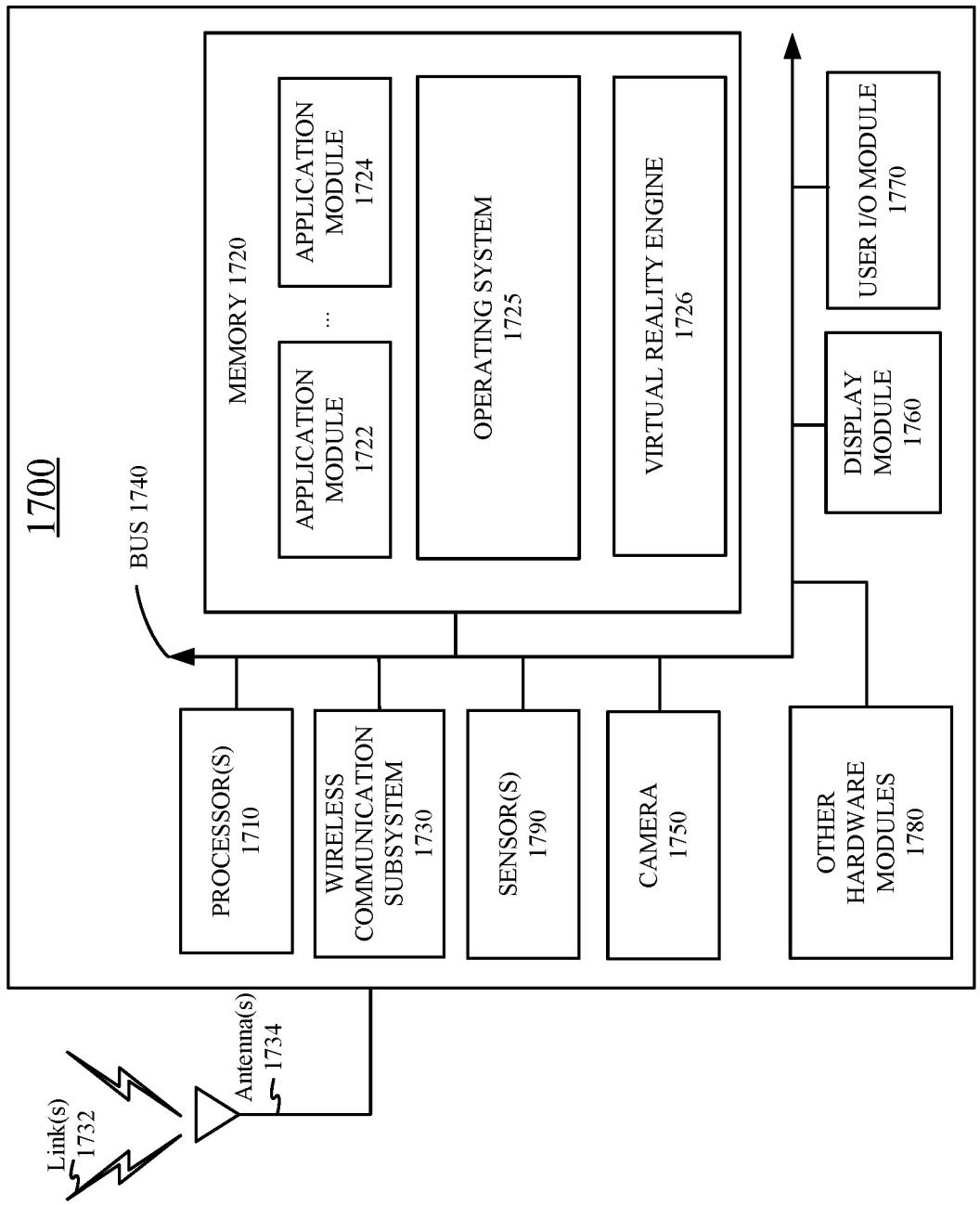
FIG. 17 is a simplified block diagram of an electronic system of an example of a near-eye display according to certain embodiments.

FIG. 17 is a simplified block diagram of an example electronic system 1700 of an example near-eye display (e.g., HMD device) for implementing some of the examples disclosed herein. Electronic system 1700 may be used as the electronic system of an HMD device or other near-eye displays described above. In this example, electronic system 1700 may include one or more processor(s) 1710 and a memory 1720. Processor(s) 1710 may be configured to execute instructions for performing operations at a number of components, and can be, for example, a general-purpose processor or microprocessor suitable for implementation within a portable electronic device. Processor(s) 1710 may be communicatively coupled with a plurality of components within electronic system 1700. To realize this communicative coupling, processor(s) 1710 may communicate with the other illustrated components across a bus 1740. Bus 1740 may be any subsystem adapted to transfer data within electronic system 1700. Bus 1740 may include a plurality of computer buses and additional circuitry to transfer data.

Memory 1720 may be coupled to processor(s) 1710. In some embodiments, memory 1720 may offer both short-term and long-term storage and may be divided into several units. Memory 1720 may be volatile, such as static random access memory (SRAM) and/or dynamic random access memory (DRAM) and/or non-volatile, such as read-only memory (ROM), flash memory, and the like. Furthermore, memory 1720 may include removable storage devices, such as secure digital (SD) cards. Memory 1720 may provide storage of computer-readable instructions, data structures, program modules, and other data for electronic system 1700. In some embodiments, memory 1720 may be distributed into different hardware modules. A set of instructions and/or code might be stored on memory 1720. The instructions might take the form of executable code that may be executable by electronic system 1700, and/or might take the form of source and/or installable code, which, upon compilation and/or installation on electronic system 1700 (e.g., using any of a variety of generally available compilers, installation programs, compression/decompression utilities, etc.), may take the form of executable code.

In some embodiments, memory 1720 may store a plurality of application modules 1722 through 1724, which may include any number of applications. Examples of applications may include gaming applications, conferencing applications, video playback applications, or other suitable applications. The applications may include a depth sensing function or eye tracking function. Application modules 1722-1724 may include particular instructions to be executed by processor(s) 1710. In some embodiments, certain applications or parts of application modules 1722-1724 may be executable by other hardware modules 1780. In certain embodiments, memory 1720 may additionally include secure memory, which may include additional security controls to prevent copying or other unauthorized access to secure information.

In some embodiments, memory 1720 may include an operating system 1725 loaded therein. Operating system 1725 may be operable to initiate the execution of the instructions provided by application modules 1722-1724 and/or manage other hardware modules 1780 as well as interfaces with a wireless communication subsystem 1730 which may include one or more wireless transceivers. Operating system 1725 may be adapted to perform other operations across the components of electronic system 1700 including threading, resource management, data storage control and other similar functionality.

Wireless communication subsystem 1730 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1700 may include one or more antennas 1734 for wireless communication as part of wireless communication subsystem 1730 or as a separate component coupled to any portion of the system. Depending on desired functionality, wireless communication subsystem 1730 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1730 may permit data to be exchanged with a network, other computer systems, and/or any other devices described herein. Wireless communication subsystem 1730 may include a means for transmitting or receiving data, such as identifiers of HMD devices, position data, a geographic map, a heat map, photos, or videos, using antenna(s) 1734 and wireless link(s) 1732. Wireless communication subsystem 1730, processor(s) 1710, and memory 1720 may together comprise at least a part of one or more of a means for performing some functions disclosed herein.

Embodiments of electronic system 1700 may also include one or more sensors 1790. Sensor(s) 1790 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1790 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 1700 may include a display module 1760. Display module 1760 may be a near-eye display, and may graphically present information, such as images, videos, and various instructions, from electronic system 1700 to a user. Such information may be derived from one or more application modules 1722-1724, virtual reality engine 1726, one or more other hardware modules 1780, a combination thereof, or any other suitable means for resolving graphical content for the user (e.g., by operating system 1725). Display module 1760 may use LCD technology, LED technology (including, for example, OLED, ILED, µ-LED, AMOLED, TOLED, etc.), light emitting polymer display (LPD) technology, or some other display technology.

Electronic system 1700 may include a user input/output module 1770. User input/output module 1770 may allow a user to send action requests to electronic system 1700. An action request may be a request to perform a particular action. For example, an action request may be to start or end an application or to perform a particular action within the application. User input/output module 1770 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1700. In some embodiments, user input/output module 1770 may provide haptic feedback to the user in accordance with instructions received from electronic system 1700. For example, the haptic feedback may be provided when an action request is received or has been performed.

Electronic system 1700 may include a camera 1750 that may be used to take photos or videos of a user, for example, for tracking the user's eye position. Camera 1750 may also be used to take photos or videos of the environment, for example, for VR, AR, or MR applications. Camera 1750 may include, for example, a complementary metal-oxide-semiconductor (CMOS) image sensor with a few millions or tens of millions of pixels. In some implementations, camera 1750 may include two or more cameras that may be used to capture 3-D images.

In some embodiments, electronic system 1700 may include a plurality of other hardware modules 1780. Each of other hardware modules 1780 may be a physical module within electronic system 1700. While each of other hardware modules 1780 may be permanently configured as a structure, some of other hardware modules 1780 may be temporarily configured to perform specific functions or temporarily activated. Examples of other hardware modules 1780 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1780 may be implemented in software.

In some embodiments, memory 1720 of electronic system 1700 may also store a virtual reality engine 1726. Virtual reality engine 1726 may execute applications within electronic system 1700 and receive position information, acceleration information, velocity information, predicted future positions, or any combination thereof of the HMD device from the various sensors. In some embodiments, the information received by virtual reality engine 1726 may be used for producing a signal (e.g., display instructions) to display module 1760. For example, if the received information indicates that the user has looked to the left, virtual reality engine 1726 may generate content for the HMD device that mirrors the user's movement in a virtual environment. Additionally, virtual reality engine 1726 may perform an action within an application in response to an action request received from user input/output module 1770 and provide feedback to the user. The provided feedback may be visual, audible, or haptic feedback. In some implementations, processor(s) 1710 may include one or more GPUs that may execute virtual reality engine 1726.

In various implementations, the above-described hardware and modules may be implemented on a single device or on multiple devices that can communicate with one another using wired or wireless connections. For example, in some implementations, some components or modules, such as GPUs, virtual reality engine 1726, and applications (e.g., tracking application), may be implemented on a console separate from the head-mounted display device. In some implementations, one console may be connected to or support more than one HMD.

In alternative configurations, different and/or additional components may be included in electronic system 1700. Similarly, functionality of one or more of the components can be distributed among the components in a manner different from the manner described above. For example, in some embodiments, electronic system 1700 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A micro-light emitting diode (micro-LED) device comprising:
    a backplane wafer including electrical circuits fabricated thereon;
    a back reflector and contact layer bonded to the backplane wafer and isolated into a plurality of electrodes by a plurality of dielectric structures;
    a first sublayer of a first semiconductor material coupled to the back reflector and contact layer;
    a plurality of semiconductor mesa structures on the first sublayer of the first semiconductor material, each semiconductor mesa structure of the plurality of semiconductor mesa structures including:
        a second sublayer of the first semiconductor material;
        an active region; and
        a second semiconductor layer;
    a passivation layer on sidewalls of the plurality of semiconductor mesa structures;
    transparent dielectric material regions between semiconductor mesa structures of the plurality of semiconductor mesa structures; and
    grating couplers in regions of the first sublayer of the first semiconductor material that are aligned with the transparent dielectric material regions,
    wherein the regions of the first sublayer of the first semiconductor material are configured to guide light emitted in the active regions of the plurality of semiconductor mesa structures to the grating couplers; and
    wherein the grating couplers are configured to diffract the light guided by the regions of the first sublayer of the first semiconductor material towards the transparent dielectric material regions.

2. The micro-LED device of claim 1, further comprising sidewall reflectors on sidewalls of the passivation layer and between the passivation layer and the transparent dielectric material regions.

3. The micro-LED device of claim 2, wherein the sidewall reflectors are on some but not all sidewalls of the passivation layer.

4. The micro-LED device of claim 1, further comprising a transparent conductive layer on the plurality of semiconductor mesa structures and the transparent dielectric material regions.

5. The micro-LED device of claim 4, further comprising front reflectors on or in the transparent conductive layer, the front reflectors aligned with the second semiconductor layer of each semiconductor mesa structure of the plurality of semiconductor mesa structures and configured to reflect light incident on the front reflectors.

6. The micro-LED device of claim 1, wherein the plurality of dielectric structures electrically isolates the first sublayer of the first semiconductor material into a plurality of regions.

7. The micro-LED device of claim 6, further comprising a plurality of optical isolation structures in the regions of the first sublayer of the first semiconductor material, the plurality of optical isolation structures optically isolating the plurality of regions of the first sublayer of the first semiconductor material.

8. The micro-LED device of claim 7, wherein each optical isolation structure of the plurality of optical isolation structures is adjacent to a respective dielectric structure of the plurality of dielectric structures.

9. The micro-LED device of claim 1, wherein the grating couplers include straight or slanted grating ridges that have a refractive index different from a refractive index of the first semiconductor material.

10. The micro-LED device of claim 1, wherein the plurality of dielectric structures is in contact with dielectric material regions of the backplane wafer.

11. The micro-LED device of claim 1, wherein the grating couplers are on or are partially in the back reflector and contact layer.

12. A micro-light emitting diode (micro-LED) comprising:
- a back reflector and contact layer laterally surrounded by a dielectric structure;
- a first sublayer of a first semiconductor material on the back reflector and contact layer and laterally surrounded by an optical isolation structure;
- a semiconductor mesa structure in a first lateral region of the micro-LED, the semiconductor mesa structure including:
  - a second sublayer of the first semiconductor material;
  - an active region; and
  - a second semiconductor layer;
- an insulator layer on sidewalls of the semiconductor mesa structure;
- a transparent dielectric material region in a second lateral region of the micro-LED, the insulator layer between the semiconductor mesa structure and the transparent dielectric material region; and
- a grating coupler in a region of the first sublayer of the first semiconductor material that is aligned with the transparent dielectric material region,
- wherein the region of the first sublayer of the first semiconductor material is configured to guide light emitted in the active region of the semiconductor mesa structure to the grating coupler; and
- wherein the grating coupler is configured to diffract the light guided by the region of the first sublayer of the first semiconductor material towards the transparent dielectric material region.

13. The micro-LED of claim 12, wherein the insulator layer includes a passivation layer and a sidewall reflector layer.

14. The micro-LED of claim 13, wherein the sidewall reflector layer is on some but not all sidewalls of the passivation layer.

15. The micro-LED of claim 12, further comprising a transparent conductive layer on the second semiconductor layer of the semiconductor mesa structure and the transparent dielectric material region.

16. The micro-LED of claim 15, further comprising a front reflector on or in the transparent conductive layer, the front reflector aligned with the second semiconductor layer of the semiconductor mesa structure and configured to reflect light incident on the front reflector.

17. The micro-LED of claim 12, wherein the dielectric structure laterally surrounds the first sublayer of the first semiconductor material.

18. The micro-LED of claim 12, wherein the grating coupler includes straight or slanted grating ridges that have a refractive index different from a refractive index of the first semiconductor material.

19. The micro-LED of claim 12, wherein the grating coupler is on the back reflector and contact layer or is partially in the back reflector and contact layer.

20. The micro-LED of claim 12, wherein:
- the dielectric structure is in contact with a dielectric material region of a backplane wafer; and
- the back reflector and contact layer is bonded to a metal contact pad of the backplane wafer.

* * * * *